United States Patent [19]
Gibson et al.

[11] Patent Number: 6,044,005
[45] Date of Patent: Mar. 28, 2000

[54] CONTENT ADDRESSABLE MEMORY STORAGE DEVICE

[75] Inventors: Garnet Fredrick Randall Gibson, Nepean; Farhard Shafai, Ottawa; Jason Edward Podaima, Kanata, all of Canada

[73] Assignee: Sibercore Technologies Incorporated, Ontario, Canada

[21] Appl. No.: 09/243,263

[22] Filed: Feb. 3, 1999

[51] Int. Cl.[7] ................................................ G11C 15/00
[52] U.S. Cl. ......................... 365/49; 365/154; 365/189.07
[58] Field of Search ............................. 365/49, 154, 204, 365/189.07

[56] References Cited

U.S. PATENT DOCUMENTS

| | | | |
|---|---|---|---|
| 5,051,949 | 9/1991 | Young | 365/49 |
| 5,319,590 | 6/1994 | Montoye | 365/49 |
| 5,490,102 | 2/1996 | Jubran | 365/49 |
| 5,568,415 | 10/1996 | McLellan et al. | 365/49 |
| 5,598,115 | 1/1997 | Holst | 326/119 |
| 5,621,677 | 4/1997 | Jones | 365/49 |
| 5,646,878 | 7/1997 | Samra | 365/49 |
| 5,699,288 | 12/1997 | Kim et al. | 365/49 |
| 5,703,803 | 12/1997 | Shadan et al. | 365/49 |
| 5,726,942 | 3/1998 | Yoneda et al. | 365/208 |
| 5,740,097 | 4/1998 | Satoh | 365/49 |
| 5,754,463 | 5/1998 | Henstrom et al. | 365/49 |
| 5,930,161 | 7/1999 | Sheikholeslami et al. | 365/49 |
| 5,949,696 | 9/1999 | Threewitt | 365/49 |
| 5,978,246 | 11/1999 | Shindo | 365/49 |

FOREIGN PATENT DOCUMENTS 0 858 077 A2  1/1998  European Pat. Off. .

OTHER PUBLICATIONS

K. Schultz et al, "A Survey of Content Addressable Memory Cells", *Integration, the VSI Journal*, vol. 23, pp. 171–188, 1997.

K. Schultz et al, "Fully–Parallel 30–MHz, 2.5–Mb CAM", *Journal of Solid State Circuits*, vol. 33, pp. 1690–1696, Nov. 1998.

*Primary Examiner*—David Nelms
*Assistant Examiner*—Hien Nguyen
*Attorney, Agent, or Firm*—Heslin & Rothenberg, P.C.

[57] ABSTRACT

Binary and ternary content addressable memory (CAM) cells are disclosed, which permit the construction of high-performance, large-capacity CAM arrays. The CAM cells have a reduced match line power dissipation, and a reduced compare line loading that is data independent, and full swing comparator output. Match line power dissipation is limited by means of a NAND chain match line. Loading on compare lines is limited by connecting compare lines to the gate terminals of the CAM cell comparator. Local precharge devices at the output of the comparator provide full swing compare logic levels for faster matching. The same precharge devices also serve as an active reset for the comparator. Comparator circuits for ternary CAM cells further employ disable means, which makes the comparison operation conditional on the value stored in the mask memory element. The use of disable means allows the mask and data to be stored separately in a non-encoded form. As a result, mask and data information may be read and written independently of one another.

32 Claims, 20 Drawing Sheets

CONTENT ADDRESSABLE MEMORY STORAGE DEVICE

BACKGROUND OF THE INVENTION

1. Field of Invention

The present invention relates to content addressable memory (CAM), and more specifically content addressable memory storage elements suitable for constructing high-speed, large-capacity, binary or ternary CAM arrays.

2. Description of the Background Art

A content addressable memory (CAM) is a memory in which a group of memory elements are selected or identified by their content, rather than by their physical location. A CAM includes a matrix of CAM cells arranged in rows and columns. Each CAM cell includes compare logic, and stores one bit of digital information. One or more bits of information constitute a word. A content addressable memory compares a search word (comparand) with a set of words stored within the CAM. During the compare operation, an indicator associated with each stored word produces a comparison result, indicating whether or not the search word matches the stored word.

FIG. 1 shows one particular binary CAM cell according to prior art, including a match logic circuit (transistors T2, T3 and T4), two transistor access devices T0 and T1, and a memory element D0. The memory element D0 stores one bit of digital information. FIG. 2 shows a typical implementation of a static memory element D0 using two NMOS transistors T2 and T3 and two PMOS transistors T0 and T1, according to prior art. The static memory element D0 has two states and two complementary cell nodes C and CN. In one state, C has a high signal level and CN has a low signal level, whereas in the other state, CN has a high level and C has a low level. The two access devices T0 and T1 in FIG. 1 couple the memory element D0 to two complementary bit lines BL and BLN, respectively. The data access device T0 connects C to BL and the second access device T1 connects CN to BLN. A word line WL connects together the gate terminals of the two access devices T0 and T1. A comparator having two transistor discharge devices T3 and T2 couples the two cell nodes C and CN respectively to two complementary compare lines designated as K and KN. The output of the comparator, designated as X, indicates the result of the comparison. The comparison results for an entire word in a binary CAM array are transmitted to a match line ML via the match output device T4 in a wired-NOR configuration.

A binary CAM cell has three distinct modes of access by means of the following operations; a read operation, a write operation and a compare operation.

1) During the read operation, the signal level at WL (initially low) is asserted high, activating the two access devices T0 and T1. With WL high, the activated data access device T0 is conducting, and C is electrically connected to BL. Similarly, when WL is high, an electrical connection is made between CN and BLN via the second access device T1. Once such electrical connection is established, the one bit of differential data stored in the memory element D0 of the CAM cell is transmitted or read out to the bit lines BL and BLN. After a read operation, WL is returned low, de-activating the two access devices T0 and T1, and thereby isolating the memory element D0 from the bit lines. Bit lines BL and BLN (initially precharged to a high state) are returned to a precharged (reset) state following the read operation. FIG. 3 shows the signal levels and timing for a typical read operation, according to prior art.

2) During the write operation, one bit of differential data is placed on the bit lines BL and BLN. One state is asserted on BL and its complement is placed on BLN. WL (initially low) is asserted high, activating the two access devices T0 and T1. With WL high, the activated data access device T0 is conducting, and C is electrically connected to BL. Similarly, an electrical connection is made between CN and BLN via the second access device T1. The differential data placed on the bit lines BL and BLN, is transmitted or written to the memory element D0 of the CAM cell for storage. Upon completion of a write operation, WL is returned low, de-activating transistors T0 and T1, and thereby isolating the memory element D0 from the bit lines. Bit lines BL and BLN (initially precharged to high state) are returned to the precharged (reset) state following the write operation. FIG. 4 shows the signal levels and timing for the write operation.

3) For the compare operation, one bit of differential compare data is placed on the compare lines K and KN. One state is asserted on K while its complement is placed on KN. The comparator logic circuit determines if the bit of compare data is equivalent to the data stored in the memory element D0. If K is equivalent to C in signal level, then the comparator output node X is low and the match line ML (initially precharged high) remains unaffected—indicating a match. If K is not equivalent to C, then the comparator output node X goes high to enable T4, and ML is pulled low—indicating a non-match (also called a "miss"). For example, if both C and KN are high then an output node X of the comparator is charged high through T3, activating the match output device T4. Consequently, the wired-NOR match output at ML is pulled low by T4, indicating a non-match. Similarly, if CN and K are both high then the output node X is charged high through T2, activating the pull down device T4. Subsequently, ML is pulled low indicating a non-match. After a compare operation, both compare lines K and KN are returned to a low signal level to discharge the comparator output node X through either T2 or T3 depending on the state of the memory element D0. Discharging of the output node X resets the comparator discharge devices T2 and T3, disables T4 and allows ML to be precharged to a high state for the next compare operation. FIG. 5 shows typical signal levels and timing for the compare operation, according to prior art.

There are several known approaches to CAM cells in the art. A journal paper by Kenneth J. Schultz entitled "A Survey of Content-addressable Memory Cells" published in Integration, the VLSI Journal, Vol. 23, pp. 171–188, 1997 describes several CAM cell designs and summarizes the advantages and disadvantages of each. The CAM cell of FIG. 1 and other similar configurations in the art, have certain unfavourable characteristics for constructing high-performance, large-capacity CAM arrays such as the following:

1) The compare lines are typically connected to the source or drain terminals of the comparator circuit transistors, causing the compare lines to be heavily loaded resulting in higher power consumption, and slower search operations. It should also be noted that for a CAM cell similar to FIG. 1, the loading on the compare lines is data dependant, which means that the CAM must be designed for memory data patterns which represent the worst case loading conditions. For example, if all CAM cells in the same column of the CAM array contain the same data, a non-match within the column would require one compare line to discharge all the X nodes within the column. The result is an increased effective load on one of the compare lines.

2) The comparator output node X does not experience a full signal swing. The discharge devices T2 or T3 are unable to charge the output node X to a voltage equivalent to the full power supply voltage. As a result, the match output device T4 is not completely turned on and the discharge of the match line ML is done at a slower rate, thereby slowing down the matching process. One could employ PMOS devices for the comparator to solve this problem, however in doing so another problem is created. PMOS devices would not be able to discharge the output node X completely, making the resetting of ML difficult if not impossible, since NMOS match output transistor T4 would remain on.

3) The use of wired-NOR matching is also unfavourable due to excessive power dissipation in the match lines. In wired-NOR matching, ML is discharged for non-matches. In applications where the majority of words are expected to mis-match, this technique is overly inefficient. Another disadvantage of using wired-NOR matching is that the rate of discharge of ML depends on how many CAM cells in a word are non-matching. The peak power demands of each mis-matched word is data dependant and the array must be designed according to memory patterns representing the worst case conditions.

A dynamic-NAND match function is one approach known in the art for reducing match line power dissipation in CAM's. European Patent Application, #98300490.4 published on Aug. 12, 1998 and corresponding U.S. Pat. No. 5,859,791 show a means for a dynamic NAND match in CAM's. A CAM cell employing a dynamic-NAND match reduces the power dissipation in CAM arrays permitting the construction of high-performance, large-capacity arrays. A journal paper by Kenneth J. Schultz entitled "25 MHz Fully-Parallel Content Addressable Memory", published in the Journal of Solid States Circuits, Vol. 23, pp 1690–1696, November 1998, shows how a dynamic NAND match reduces power dissipation in CAM's and gives evidence that high-performance, large-capacity CAM arrays are realizable with this technique.

In view of the above discussion of prior art, there is clearly a need for CAM cell configurations that demand relatively lower power consumption while offering a relatively faster match and search operation.

It is known in the art, that a column of CAM cells may be excluded from the search or compare operation by asserting both compare lines low (or high in some CAM cells). This however, does not provide masking on a per cell basis. In order to exclude particular CAM cells from a search or compare, an additional storage bit is required to represent more than two states. A third state representing a "don't care" or "masked" state may be used to exclude the CAM cell from the search or compare operation, by forcing the cell to match regardless of the applied comparand data, K and KN. Cells capable of storing a third state for per bit masking purposes are known in the art as ternary CAM cells.

In regards to a ternary CAM configuration, U.S. Pat. Nos. 5,319,590 and 5,051,949 disclose the use of two storage bits and a compare logic circuit per CAM cell to encode a "don't care" state. A "don't care" state excludes the CAM cell from comparison by forcing the CAM cell to match independent of the state of the inputs at the compare lines K and KN. The ternary CAM cell designs described in these two patents store data and mask information in an encoded format. A problem with this approach is that during decoding, the masked data information is lost where masked data is read out as "0" or low state. Encoding also requires that both mask and data be written simultaneously. In this respect it is desirable to have a new CAM design that avoids the need for encoding the information.

SUMMARY OF THE INVENTION

An object of the present invention is to provide an improved content addressable memory (CAM) cell suitable for constructing high-speed and large-capacity binary or ternary CAM arrays. The present invention takes advantage of one or more of the following design features in the disclosed CAM cells:

(1) Bit lines are separated from the compare lines to reduce loading on both the compare lines and bit lines, permitting the construction of larger and faster CAM arrays. With separate compare and bit lines, the search operation can be performed without affecting precharge timing of the read/write operation. Furthermore, signal levels of the compare lines at the end of search operation do not have to coincide with precharge levels for a read/write operation. The result is a CAM cell with a bandwidth potential approaching twice that of a CAM cell without separate bit and compare lines.

(2) Local amplification for the compare lines is provided through the gates of discharge devices. This way, loading on the compare lines is independent of data stored in the CAM cells. In addition, loading on the compare lines is reduced, since the compare lines are connected to the gate terminals of the comparator means rather than to the source or drain terminals.

(3) Means for precharging the comparator output is provided, which generates full swing logic levels and functions as a reset of the comparator after a compare operation. Full swing logic levels at the comparator output provide faster matching for wired-NOR or NAND matching.

(4) In the case of a ternary CAM cell, means for disabling the comparator are provided, thereby allowing one bit to represent the mask and the other bit to represent the data, without a requirement for special encoding of the mask and data. In this configuration, the mask and data information may be read and written from the storage cells separately and independently of one another. This way, data information is not lost and may be retrieved with a normal read data operation. Furthermore, the mask and data bits may be read and written at different times independently of one another.

In accordance with an aspect of this invention, there is provided a content addressable memory cell comprising:

a) a memory element for storing a data bit, said memory element having a cell node;

b) access means coupled to said memory element and to a bit line, wherein said access means is responsive to a word line for coupling said cell node to said bit line during a change in signal level in said word line in a first predetermined direction;

c) comparator means coupled to said cell node and to a compare line for performing a comparison between signal levels at said cell node and said compare line, during a change in signal level in said compare line in a second predetermined direction, and for providing a comparator output indicative of said comparison; and d) resetting means for resetting said comparator means subsequent to said comparison.

In an embodiment of this invention, the content addressable memory cell further comprises match means responsive to the comparator output, wherein said content addressable memory cell is a member of a plurality of similarly formed content addressable memory cells accessing a match line driven by respective said match means of each of the content addressable memory cells. Preferably, the match means for each one of the plurality of similar content addressable memory cells comprises a logic NAND device positioned in series with one another along the match line. Alternatively, the match means for each one of the plurality of similar content addressable memory cells comprises a logic NOR device positioned in parallel with one another between a power supply node and the match line.

The memory element can contain a static memory device, a dynamic memory device, a non-volatile memory device, or a single-ended memory device.

A transistor circuit embodiment of this invention can have a combination of the following configurations:

A) The access means comprises transistor means responsive to the word line for coupling the cell node to the bit line.
B) The comparator means comprises a pair of a first and a second transistor means in a series configuration for coupling the cell node to a power supply node, wherein said first transistor means is responsive to the compare line and said second transistor means is responsive to the cell node.
C) The resetting means comprises transistor means responsive either to the compare line for coupling the comparator output to a power supply node, or to a precharge line for coupling the comparator output to a power supply node.

In accordance with another aspect of this invention, there is provided a ternary content addressable memory cell comprising:

a) a data memory element for storing a data bit, said data memory element having a data cell node;
b) a mask memory element for storing a mask bit, said mask memory element having a mask cell node;
c) data access means coupled to said data memory element and to a data bit line,
d) mask access means coupled to said mask memory element and to a mask bit line; wherein said data and mask access means are responsive to a word line for coupling said data and mask cell nodes to said data and mask bit lines respectively during a change in signal level in said word line in a first predetermined direction;
e) comparator means coupled to said data and mask cell nodes and to a compare line for performing a comparison between signal levels at said data cell node and said compare line, during a change in signal level in said compare line in a second predetermined direction, and for providing a comparator output indicative of said comparison; and
f) disable means responsive to said mask cell node for disabling said comparator output when the mask cell node has a predetermined signal level.

In another embodiment of this invention, the content addressable memory cell further comprises match means responsive to the comparator output, wherein said content addressable memory cell is a member of a plurality of similarly formed content addressable memory cells accessing a match line driven by respective said match means of each of the content addressable memory cells.

Preferably, the match means for each one of the plurality of similar content addressable memory cells comprises a logic NAND device positioned in series with one another along the match line. Alternatively, the match means for each one of the plurality of similar content addressable memory cells comprises a logic NOR device positioned in parallel with one another between a power supply node and the match line.

Furthermore, the ternary content addressable memory cell may comprise resetting means for resetting said comparator means subsequent to said comparison. The disable means may also comprise transistor means for decoupling the comparator output from the comparator means.

A transistor circuit embodiment of the ternary content addressable memory cell can have a combination of the following configurations:

A) The comparator means comprises transistor means responsive to the compare line for coupling the data cell node to the comparator output, and the disable means comprises transistor means responsive to a complement of the compare line for coupling the mask cell node to the comparator output.
B) The disable means comprises transistor means for either decoupling the data cell node from the comparator means, shunting the comparator means, or shunting the logic NAND device when implemented within the match line.

BRIEF DESCRIPTION OF THE DRAWINGS

Exemplary embodiments of the invention will now be further described with references to the drawings wherein.

DETAILED DESCRIPTION OF THE INVENTION

Figure 6A:
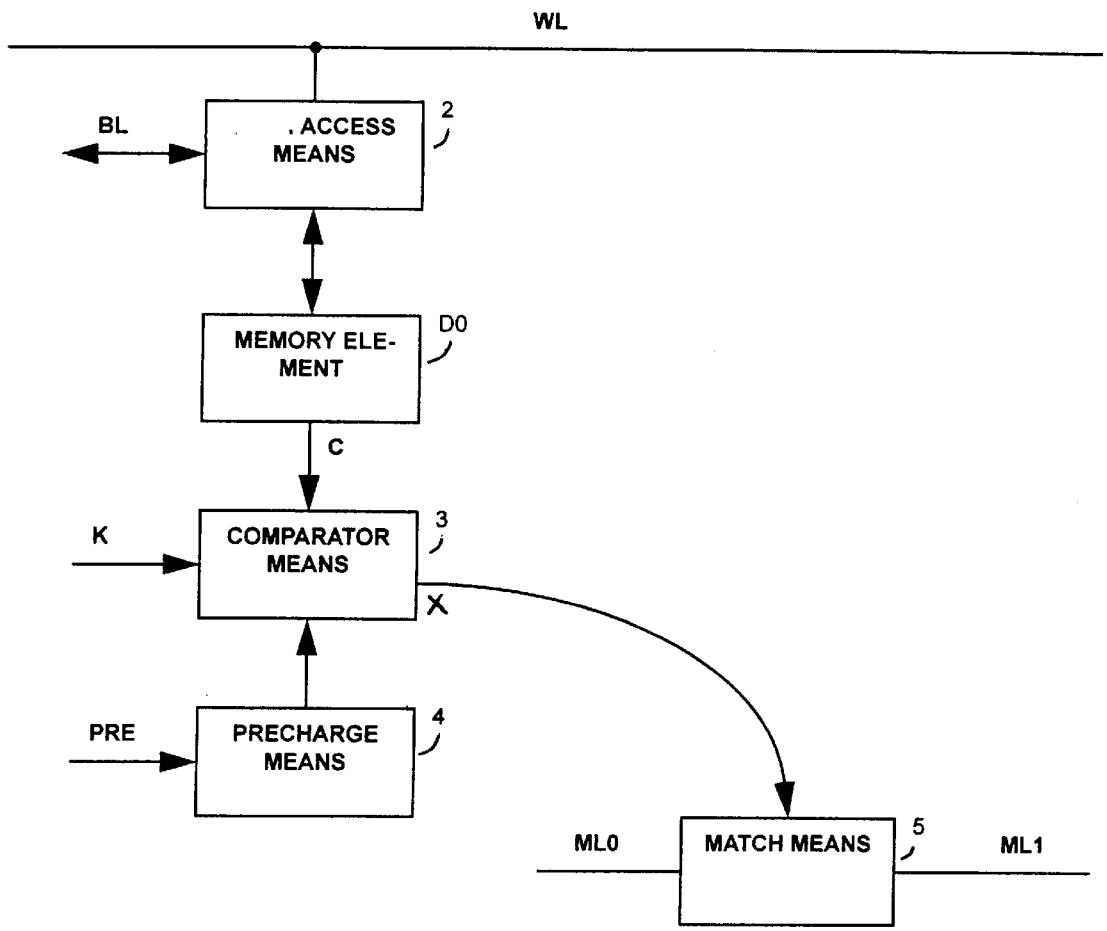
FIGS. 6A and 6B illustrate a binary CAM cell according to a preferred first embodiment of the present invention.
Figure 6B:
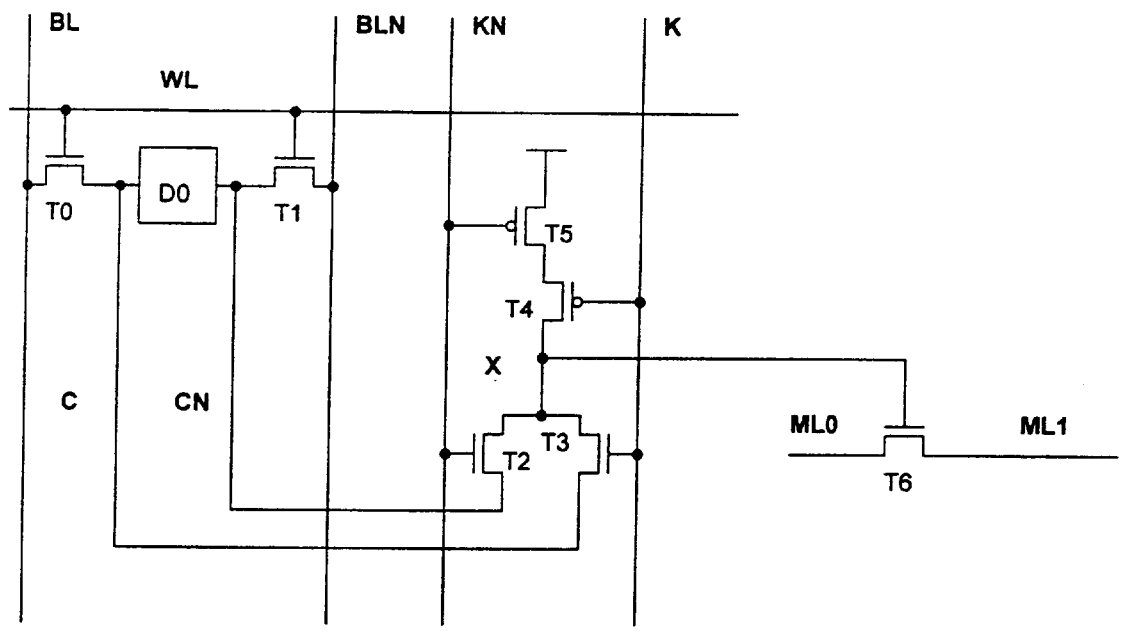

A binary CAM cell in accordance with a first embodiment of the present invention is illustrated in FIGS. 6A and 6B. FIG. 6A illustrates this embodiment in a block diagram, whereas FIG. 6B illustrate the same embodiment in a circuit diagram.

In FIG. 6A a binary CAM cell is shown as having a memory element Do having a cell node C, access means 2, comparator means 3 having an output node X, resetting means 4 and match means 5. The access means 2, upon receiving an appropriate signal from a word line WL, couples the memory element D0 to a bit line BL for read and write operations. The comparator means 3, upon receiving an appropriate signal from a compare line K, performs a comparison between the signal levels at the cell node C and the compare line K, and provides a comparison result accordingly at the comparator output node X. The resetting means 4, upon receiving an appropriate signal from a precharge line PRE, precharges the comparator means to its initial state before the comparison operation was performed.

Figure 1:
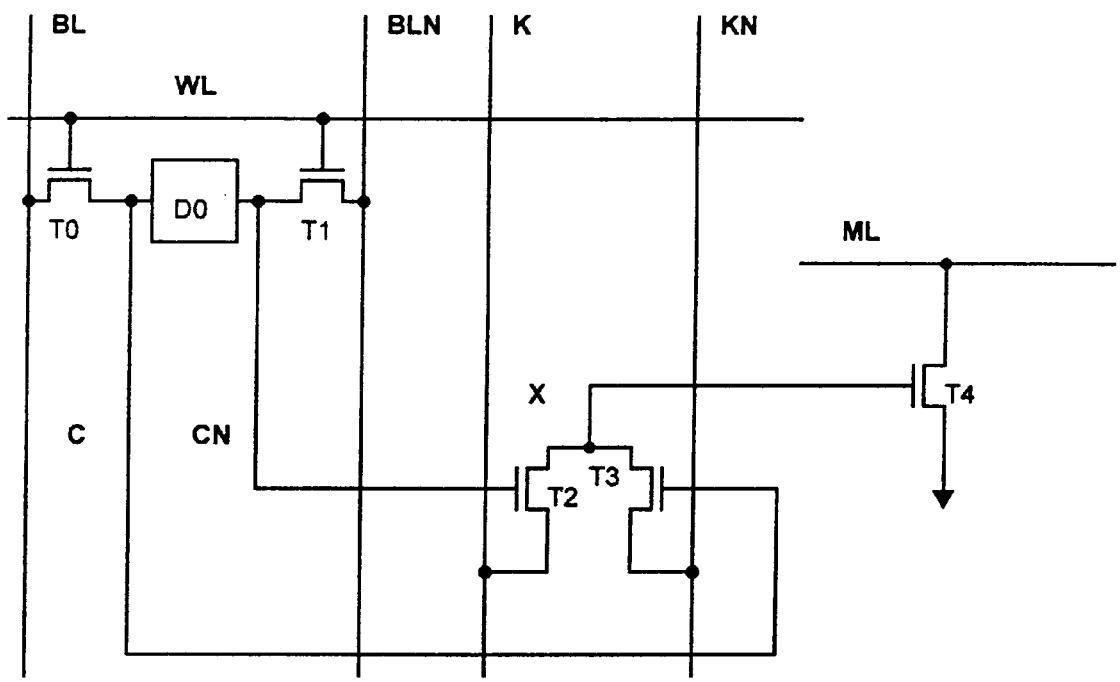
FIG. 1 illustrates a prior art content addressable memory cell.
Figure 2:
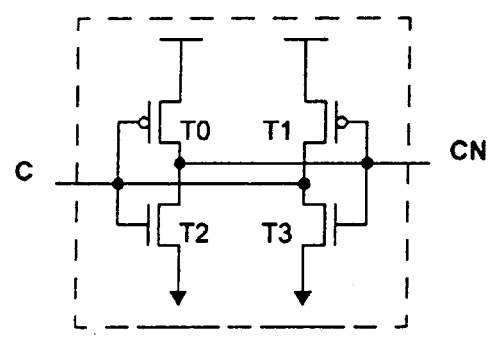
FIG. 2 illustrates a prior art 4-transistor static memory element.
Figure 3:
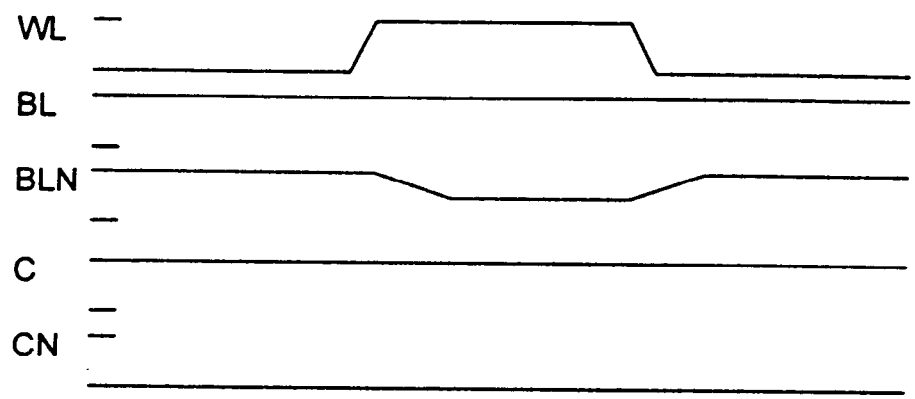
FIG. 3 illustrates signal levels and timing for a read operation relevant to FIG. 1.
Figure 4:
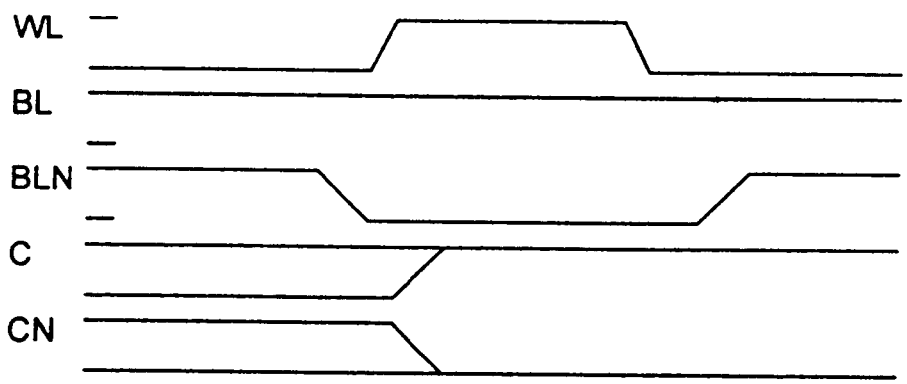
FIG. 4 illustrates signal levels and timing for a write operation relevant to FIG. 1.
Figure 5:
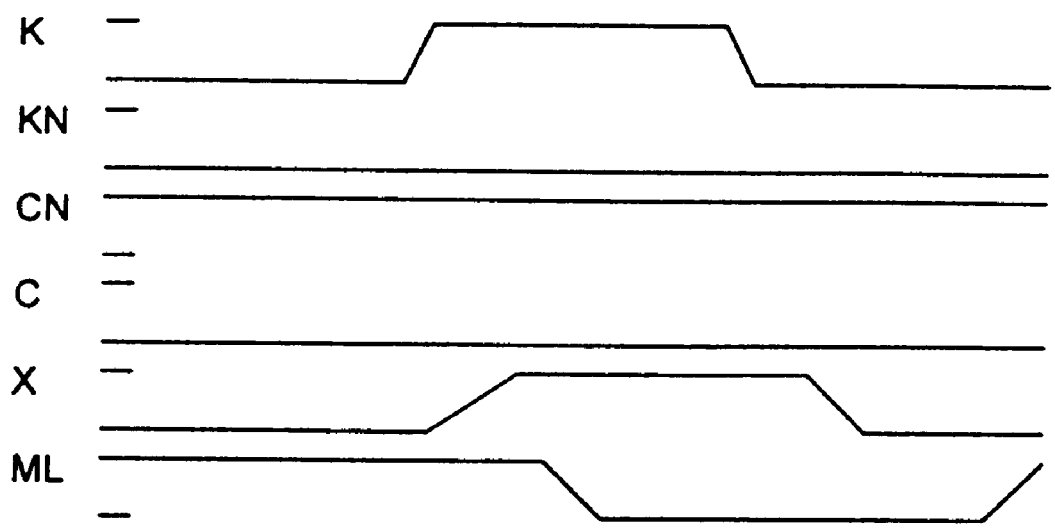
FIG. 5 illustrates signal levels and timing for a search operation relevant to FIG. 1 wherein waveforms indicate a non-match.

FIG. 6B shows the binary CAM cell in a transistor circuit configuration. As shown in this figure, the access means 2 consists of two transistor access devices T0 and T1, the comparator means 3 consists of two transistor discharge devices T2 and T3, the resetting means 4 consists of two transistor precharge devices T4 and T5, and the match means 5 consists of a transistor NAND match device T6. Also in FIG. 6B, the precharge line PRE and the compare line K are the same. Here, the memory element D0 of the CAM cell stores one bit of digital information. As an example for the memory element D0, a typical implementation of a static memory element is shown in FIG. 2, which uses two NMOS transistors T2 and T3 and two PMOS transistors T0 and T1. This static memory element D0 has two states and two complementary cell nodes C and CN. In one state, C has a high signal level and CN has a low signal level, whereas in the other state, CN is high and C is low. The two access devices T0 and T1 in FIG. 6B couple the memory element D0 to two complementary bit lines BL and BLN, respectively. The data access device T0 connects C to BL and the second access device T1 connects CN to BLN. A word line WL connects together the gate terminals of the two access devices T0 and T1. A comparator having two discharge devices T3 and T2 couples the cell nodes C and CN respectively to two complementary compare lines K and KN. T2 connects CN to a comparator output node X and T3 connects C to X. The gate terminal of T2 is connected to KN and the gate terminal of T3 is connected to K. The two precharge devices T4 and T5 are connected in series from the power supply node to the comparator output node designated as X. The gate terminal of T5 is connected to KN and the gate terminal of T4 is connected to K. The comparator output X indicates the result of the compare operation for the CAM cell. The comparator output node X is connected to the gate terminal of the NAND match device T6. The NAND match device T6, in series with other match devices of the same word, is used to combine compare information from all CAM cells within a word. This mechanism is used to determine if all CAM cells within a word match a compare word.

In alternative embodiments to that shown in FIG. 6B, the gate terminal of T5 is connected to K, whereas the gate terminal of T4 is connected to KN.

The CAM cell, according to the first embodiment has three distinct modes of access by means of the following operations; a read operation, a write operation and a compare operation.

Figure 7:
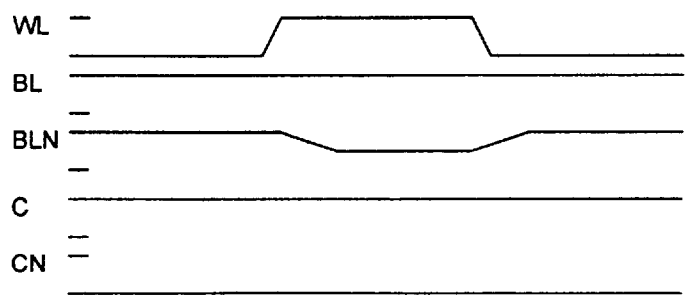
FIG. 7 illustrates signal levels and timing for a read operation relevant to FIG. 6B.

1) During the read operation, the signal level at WL (initially low) is asserted high, activating the two access devices T0 and T1. With WL high, the activated data access device T0 is conducting, and C is electrically connected to BL. Similarly, when WL is high, an electrical connection is made between CN and BLN via the second access device T1. Once such electrical connection is established, the one bit of differential data stored in the memory element D0 of the CAM cell is transmitted or read out to the bit lines BL and BLN. After a read operation, WL is returned low, de-activating the two access devices T0 and T1, and thereby isolating the memory element D0 from the bit lines. Bit lines BL and BLN (initially precharged to a high state) are returned to a precharged state following the read operation. FIG. 7 shows the signal levels and timing for a read operation as performed by the embodiment of FIG. 6B.

Figure 8:
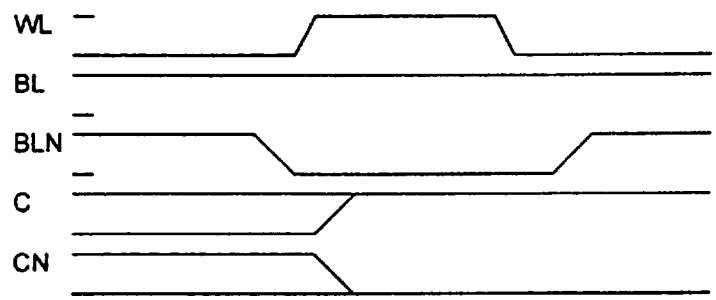
FIG. 8 illustrates signal levels and timing for a write operation relevant to FIG. 6B.
Figure 9:
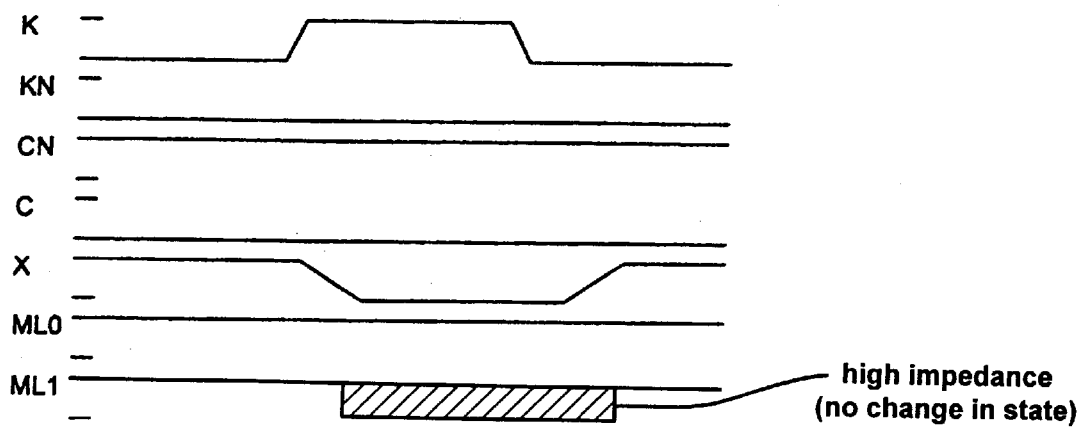
FIG. 9 illustrates signal levels and timing for a compare operation relevant to FIG. 6B, wherein waveforms indicate a non-match.

2) During the write operation, one bit of differential data is placed on the bit lines BL and BLN. One state is asserted on BL and its complement is placed on BLN. WL (initially low) is asserted high, activating the two access devices T0 and T1. With WL high, the activated data access device T0 is conducting, and C is electrically connected to BL. Similarly, an electrical connection is made between CN and BLN via the second access device T1. The differential data placed on the bit lines BL and BLN, is transmitted or written to the memory element D0 of the CAM cell for storage. Upon completion of a write operation, WL is returned low, de-activating T0 and T1, and thereby isolating the memory element Do from the bit lines. Bit lines BL and BLN (initially precharged to a high state) are returned to a precharged state following the write. FIG. 8 shows the signal levels and timing for the write operation 3) For the compare operation, one bit of differential compare data is placed on the compare lines, K and KN. One state is asserted on K while its complement is placed on KN. The compare logic determines if the bit of compare data is equivalent to the data stored in the memory element D0. If K is equivalent to C in signal level, then the comparator output X remains at an initially precharged high level—indicating a match. If K is not equivalent to C, the comparator output X is pulled low—indicating a non-match (or a "miss"). For example, if CN is low and KN is high, then the output node X (initially precharged) is discharged through T2, de-activating the NAND match device T6. Similarly, if C is low and K is high then the output node X is discharged through T3, de-activating the NAND match device T6. At the end of the compare operation, both compare line K and KN are returned to a low signal level to precharge the output node X via precharge devices T4 and T5. When K and KN are both low, T4 and T5 are conducting and bring the output node X to a high logic level. Precharging of the output node X resets the comparator for the next compare operation. FIG. 9 shows the signal levels and timing for the compare operation.

Figure 10A:
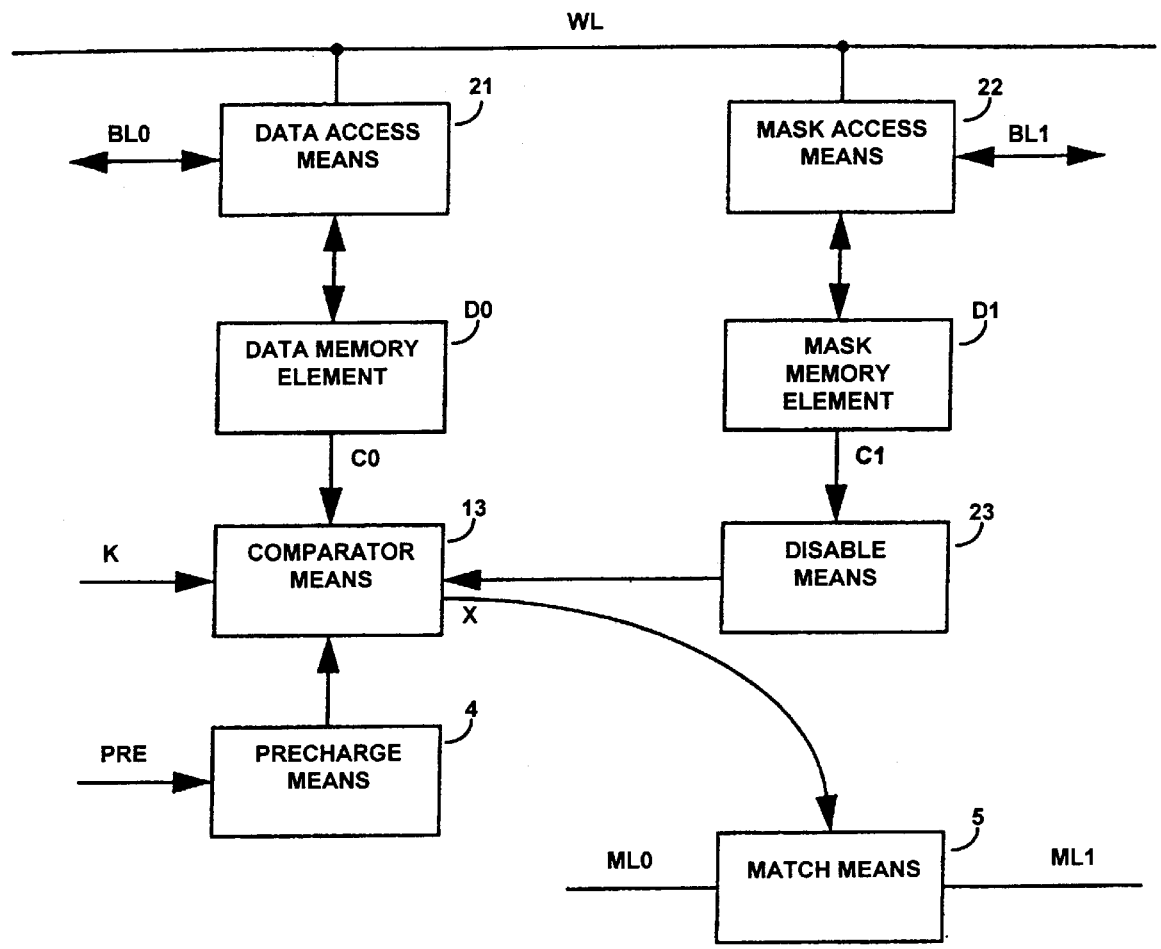
FIGS. 10A and 10B illustrate a ternary CAM core cell according to a preferred second embodiment of the present invention having individual data and mask bits, PMOS precharge device, single NMOS disable device, and NMOS-NAND match device.
Figure 10B:
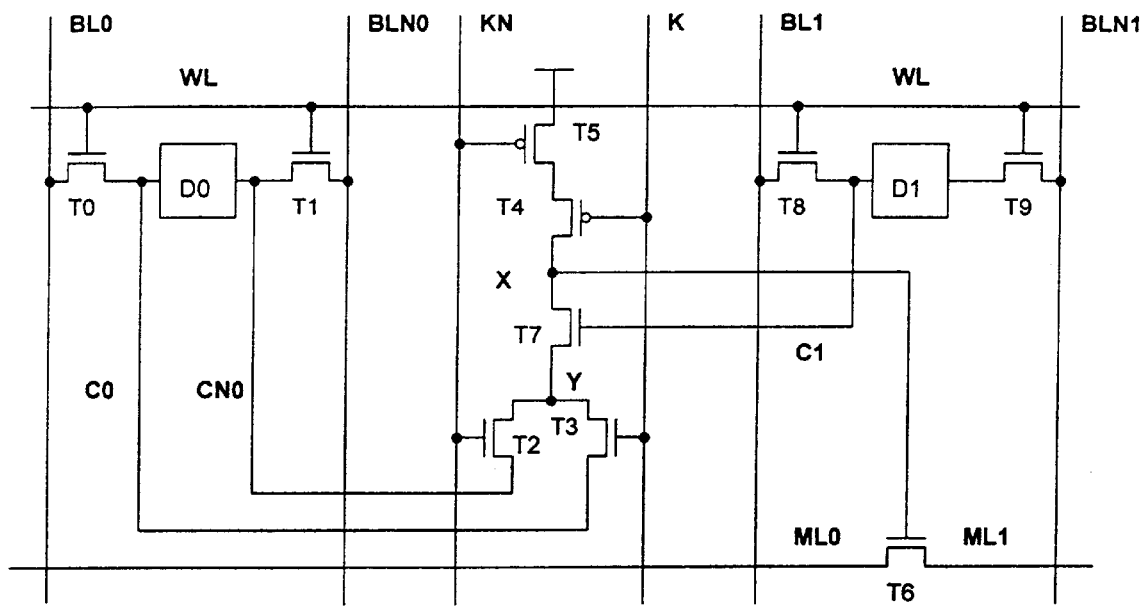

A ternary CAM cell in accordance with a second embodiment of the present invention is illustrated in FIGS. 10A and 10B. FIG. 10A illustrates this embodiment in a block diagram, whereas FIG. 10B illustrate the same embodiment in a circuit diagram.

In FIG. 10A a ternary CAM cell is shown as having a data memory element D0 and a mask memory element D1 for storing a data bit and a mask bit, and having a data and a mask cell nodes C0 and C1 respectively, data and mask access means 21 and 22, comparator means 13 having an output node X, resetting means 4, match means 5 and disable means 23. The data and mask access means 21 and 22, upon receiving an appropriate signal from a word line WL, respectively couple the memory elements D0 and D1 to a data bit line BL0 and a mask bit line BL1 for read and write operations. The comparator means 13, upon receiving an appropriate signal from a compare line K, performs a comparison between the signal levels at the cell node C0 and the compare line K, and provides a comparison result accordingly at the comparator output node X, provided that the mask bit stored in the mask memory element D1 is high. If the mask bit is low, however, the comparator output X is disabled by the disable means 23. The resetting means 4, upon receiving an appropriate signal from a precharge line PRE, precharges the comparator means 13 to its initial state before the comparison operation was performed.

FIG. 10B shows the ternary CAM cell in a transistor circuit configuration. As shown in this figure, the data access means 21 consists of two transistor access devices T0 and T1, the mask access means 22 consists of two transistor access devices T8 and T9, the comparator means 13 consists of two transistor discharge devices T2 and T3, the resetting means 4 consists of two transistor precharge devices T4 and T5, the disable means consists of a disable transistor device T7, and the match means 5 consists of a transistor NAND match device T6. Also in FIG. 10B, the precharge line PRE and the compare line K are the same. Here, each of the data and mask memory elements D0 and D1 of the ternary CAM cell store one bit of digital information. As an example for the data memory element D0, a typical implementation of a static memory element is shown in FIG. 2, which uses two NMOS transistors T2 and T3 and two PMOS transistors T0 and T1. This static memory element D0 has two states and two complementary cell nodes C and CN. In one state, C has a high signal level and CN has a low signal level, whereas in the other state, CN is high and C is low. The two access devices T0 and T1 in FIG. 10B couple the data memory element D0 to BL0 and BLN0. The data access device T0 connects C0 to BL0 and the mask access device T1 connects CN0 to BLN0. The additional two access devices T8 and T9 in FIG. 10B couple the mask memory element D1 to BL1 and BLN1. The third access device T8 connects C1 to BL1 and the fourth access device T9 connects CN1 to BLN1. The comparator 13 having discharge devices T2 and T3 is similar to the comparator 3 of the above described binary CAM cell, shown in FIG. 6B. The two precharge devices T4 and T5 are connected in series from the power supply node to the comparator output node X. The gate terminal of T4 is connected to K and the gate terminal of T5 is connected to KN. A disable device T7 connects the comparator output node X to an intermediate node Y. The gate terminal of the disable device T7 is connected to the C1 output of mask memory element D1. The source terminals of T2 and T3 are both joined at the intermediate node Y. The drain terminals of T2 and T3 are respectively connected to the CN0 and C0 outputs of the data memory element D0. T3 connects C0 to the intermediate node Y and T2 connects CN0 to the intermediate node Y. The gate terminals of T2 and T3 are connected to the KN and K lines respectively. The gate terminal of T2 is connected to KN and the gate terminal of T3 is connected to the K line. The output of the comparator X is connected to the gate terminal of the NAND chain match device T6. The disable device T7 shown in FIG. 10B allows the comparator 13 to be enabled when the mask memory element D1 stores a "1" giving a high signal level at C1. When the mask memory element D1 stores a "0" so that C1 is low, the comparator pull down path is disconnected, thereby disabling the comparator 13.

In alternative embodiments to that shown in FIG. 10B, the gate terminal of T5 is connected to K, whereas the gate terminal of T4 is connected to KN.

The ternary CAM cell, according to the second embodiment has five distinct modes of access by means of the following operations: a read data operation, a write data operation, a read mask operation, a write mask operation and a compare operation.

Figure 11:
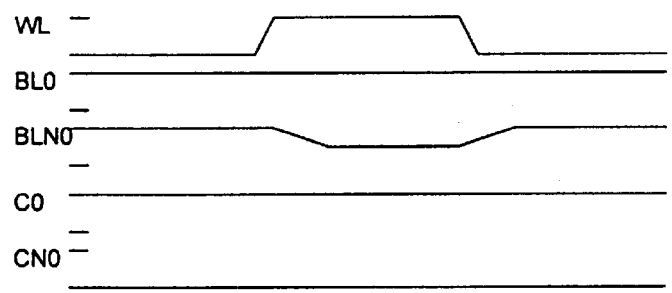
FIG. 11 illustrates signal levels and timing for a read data operation relevant to FIG. 10B.

1) During the read data operation, the signal level at WL (initially low) is asserted high, activating the two access devices T0 and T1. With WL high, the activated data access device T0 is conducting, and C0 is electrically connected to BL0. Similarly, when WL is high, an electrical connection is made between CN0 and BLN0 via the mask access device T1. Once such electrical connection is established, the one bit of differential data stored in the data memory element D0 of the ternary CAM cell is transmitted or read out to the two data bit lines BL0 and BLN0, which are initially precharged to a high state and are returned to a precharged high state following the read operation. FIG. 11 shows the signal levels and timing for read operations.

Figure 12:
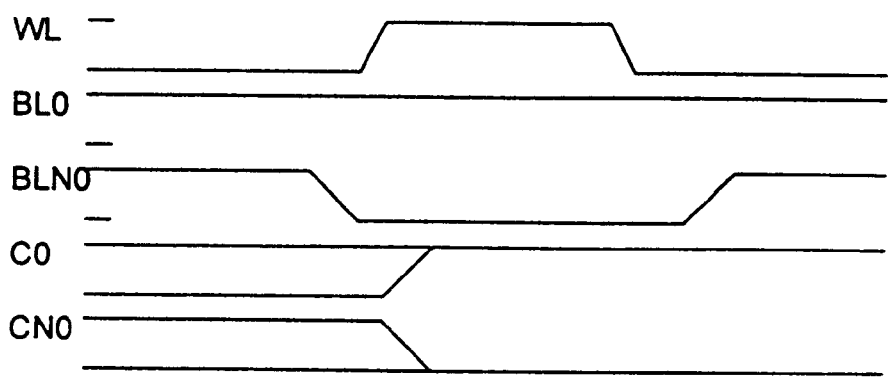
FIG. 12 illustrates signal levels and timing for write data operation relevant to FIG. 10B.

2) During the write data operation, one bit of differential data is placed on the two data bit lines BL0 and BLN0. One state is asserted on BL0 and its complement is placed on BLN0. WL (initially low) is asserted high, activating T0 and T1. With WL high, the activated data access device T0 is conducting, and C0 is electrically connected to BL0. Similarly, an electrical connection is made between CN0 and BLN0 via the mask access device T1. The differential data placed on the bit lines BL0 and BLN0, is transmitted or written to the data memory element D0 of the ternary CAM cell for storage. FIG. 12 shows the signal levels and timing for the write data operation.

Figure 13:
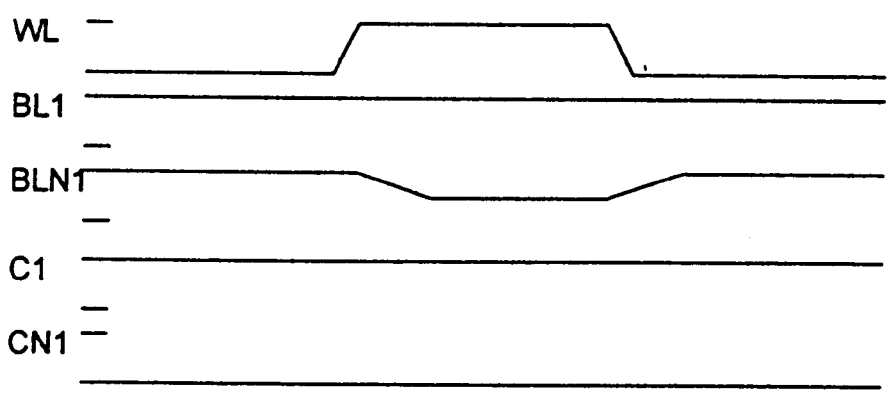
FIG. 13 illustrates signal levels and timing for a read mask operation relevant to FIG. 10B.

3) During the read mask operation, the signal level at WL is asserted high, activating T8 and T9. With WL high, the activated third access device T8 is conducting, and C1 is electrically connected to BL1. Similarly, an electrical connection is made between CN1 and BLN1 via the fourth access device T9. Once electrical connection is established, the one bit of differential data stored in the mask memory element D1 of the ternary CAM cell is transmitted or read out to the two mask bit lines BL1 and BLN1, which are initially precharged to a high state and are returned to a precharged high state following the read operation. FIG. 13 shows the signal levels and timing for the read mask operation.

Figure 14:
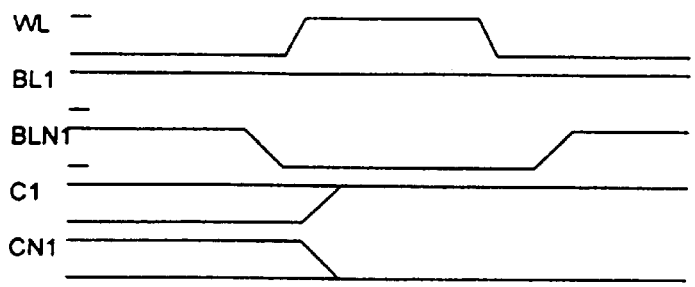
FIG. 14 illustrates signal levels and timing for a write mask operation relevant to FIG. 10B.

4) During the write mask operation, one bit of differential data is placed on the two mask bit lines BL1 and BLN1. One state is asserted on BL1 and its complement is placed on BLN1. WL (initially low) is asserted high, activating T8 and T9. With WL high, the activated third access device T8 is conducting, and C1 is electrically connected to BL1. Similarity, an electrical connection is made between CN1 and BLN1 via the fourth access device T9. The differential data placed on the mask bit lines BL1 and BLN1, is transmitted or written to the mask memory element D1 of the ternary CAM cell for storage. FIG. 14 shows the signal levels and timing for the write mask operation.

Figure 15:
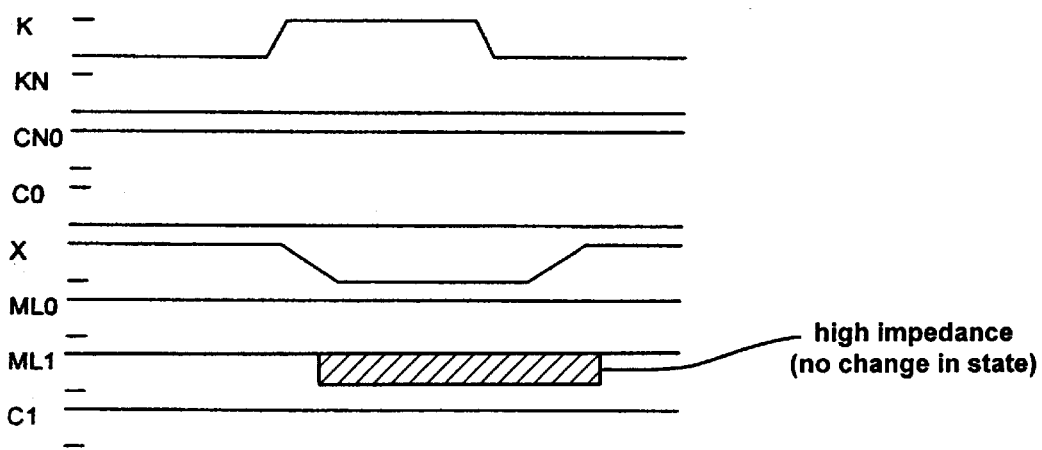
FIG. 15 Illustrates signal levels and timing for a ternary compare operation relevant to FIG. 10B.

The mask and data operations occur independently of one another and may be executed simultaneously. Four legitimate combinations of operations may occur simultaneously as follows:
a) Read Data, Read Mask
b) Read Data, Write Mask
c) Write Data, Read Mask
d) Write Data, Write Mask 5) For the compare operation, one bit of differential compare data is placed on the compare lines, K and KN. One state is asserted on K while its complement is placed on KN. When enabled, the comparator logic circuit determines if the bit of compare data is equivalent to the data stored in the data memory element D0 of the CAM cell. If the mask bit output C1 is low, the comparator 13 is disabled and the output node X remains at an initially precharged high level, regardless of the state of compare inputs K, and KN. A high logic level at the comparator output node X indicates a match for the ternary CAM cell compare operation. If the mask bit output C1 is high, the comparator 13 is enabled. When the comparator 13 is enabled, and if K is equivalent to C0 in signal level, then the comparator output X remains at an initially precharged high level—indicating a match. When the comparator 13 is enabled and if K is not equivalent to C0, the comparator output X is pulled low—indicating a non-match. For example, if the mask bit output C1 is high, and both C0 and KN are high (CN0 is low) then the output node X (initially precharged) is discharged through T2, de-activating the NAND match device T6. Similarly, if the mask bit output C1 is high and CN0 and K are both high (C0 is low) then the output node X is discharged through T3, de-activating the NAND match device T6. Both compare lines K and KN are returned to a low signal level to complete the compare operation and to precharge the output node X through T4 and T5. Precharging of the output node X resets the comparator 13 for the next compare operation. FIG. 15 shows the relevant signal levels and timing for the compare operation.

The circuit designs in FIGS. 6B and 10B are two preferred embodiments of the present invention and are presented for illustration purposes only. One reasonably skilled in the art can derive alternative embodiments without departing from the principles of the present invention, which is defined in the claims. FIGS. 16–34 illustrate nineteen other possible alternative embodiments of the present invention.

Alternative embodiments of the present invention include various combinations of the following design configurations.

1. Passive NMOS pull-down to discharge the output node X: (T2,T3) in FIGS. 16 and 17; (T4,T5) in FIGS. 23, 28 and 29; and (T6,T7) in FIG. 26.
2. Active NMOS pull-down to discharge the output node X: (T2,T3,T7,T8) in FIG. 18; (T4,T5,T6,T7) in FIGS. 25 and 30; (T6,T7,T8,T9) in FIG. 27; and (T2,T3,T4,T5) in FIG. 24.

3. Passive PMOS pull-up to charge the output node X: (T2,T3) in FIGS. 19, 21; and (T4,T5) in FIGS. 31 and 33.
4. Active PMOS pull-up to charge the output node X: (T2,T3,T7,T8) in FIGS. 20 and 22; (T4,T5,T6,T7) in FIG. 32; and (T2,T3,T4,T5) in FIG. 34.
5. Two PMOS precharge (high) devices in series: (T4,T5) in FIGS. 17, 18; (T7,T8) in FIGS. 23, 24 and 29; (T9,T10) in FIG. 25; (T8,T9) in FIGS. 26, 28 and 30, and (T10,T11) in FIG. 27.
6. Two NMOS precharge (low) devices in series: (T4,T5) in FIGS. 19, 20, 21, 22; (T7,T8) in FIGS. 31, 33 and 34; and (T8,T9) in FIG. 32.
7. A single PMOS precharge (high) device with separate precharge line: T5 in FIG. 16.
8. A single NMOS precharge (low) device with separate precharge line: Not shown
9. PMOS-NAND match line: T6 in FIGS. 21, 22, 33 and 34; T9 in FIG. 31; and T11 in FIG. 32.
10. NMOS-NAND match line: T6 in FIGS. 16, 23, and 24; T11 in FIGS. 25 and 30; T10 in FIGS. 26 and 28; T12 in FIG. 27; and T9 in FIG. 29.
11. PMOS-NOR match line: T6 in FIGS. 17 and 18.
12. NMOS-NOR match line: T6 in FIGS. 19 and 20.
13. NMOS disable device in the comparator: T7 in FIG. 16; T8 in FIG. 25; (T4,T5) in FIGS. 26 and 27; and (T6,T7) in FIG. 28.
14. PMOS disable device in the comparator: T9 in FIGS. 33 and 34.
15. NMOS disable device in a NAND-match line: T6 in FIG. 29; and T10 in FIG. 30.
16. PMOS disable device in a NAND-match line: T6 in FIG. 31; and T10 in FIG. 32.
17. Compare and Bit signals share the same lines: Not shown.
18. Disable device connected to C1 of mask memory element: FIGS. 16 and 25 to 34.
19. Disable device connected to CN1 of mask memory element: Not shown.
20. Dynamic Storage elements: Not shown.
21. Non-volatile memory elements: Not shown. 22 Single ended memory elements: Not shown.
23. Two word lines, one for mask, one for data: Not shown.

Figure 16:
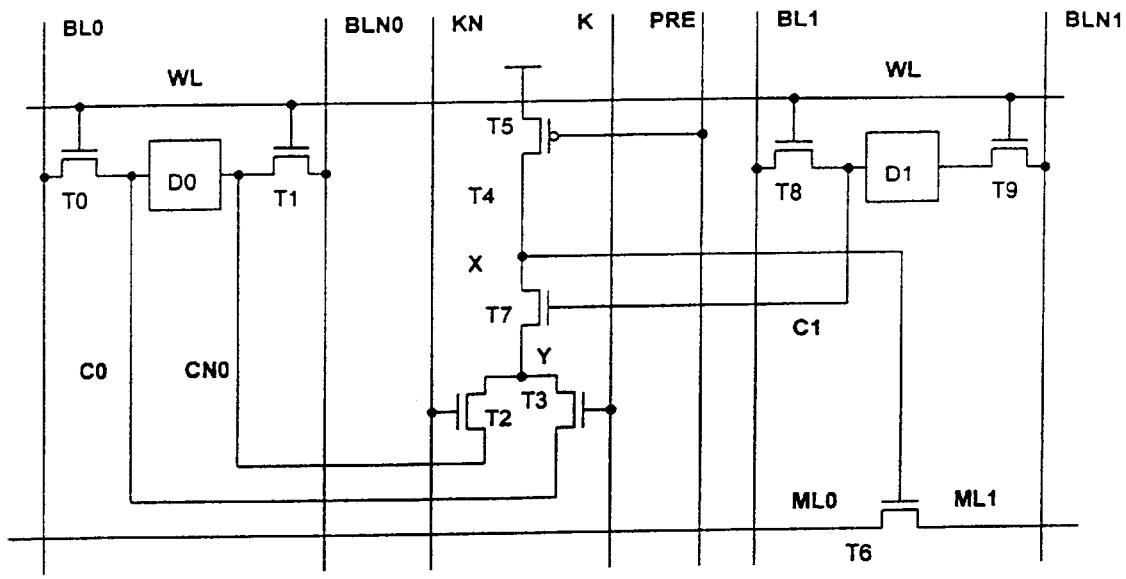
FIG. 16 Illustrates a third embodiment of a ternary CAM cell having single PMOS precharge device with separate precharge line, single NMOS disable device, passive NMOS pull-down on comparator output node X, and NMOS-NAND match device.
Figure 17:
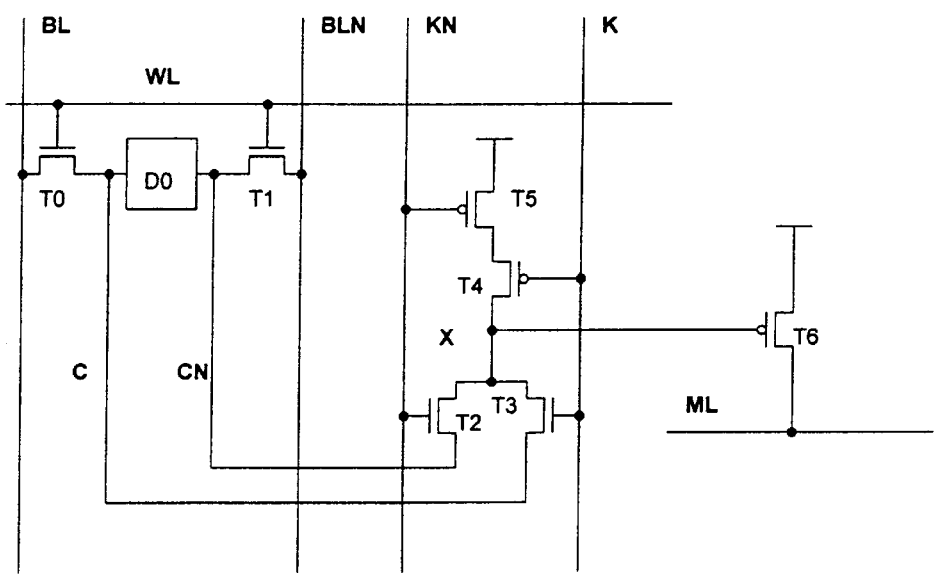
FIG. 17 illustrates a fourth embodiment of a binary CAM cell, using PMOS precharge device, passive NMOS pull-down on comparator output X, and PMOS-NOR match device.

In the third embodiment shown in FIG. 16, a single precharge device T5 is used, where a separate signal is employed and appropriately timed at the precharge line PRE.

Figure 18:
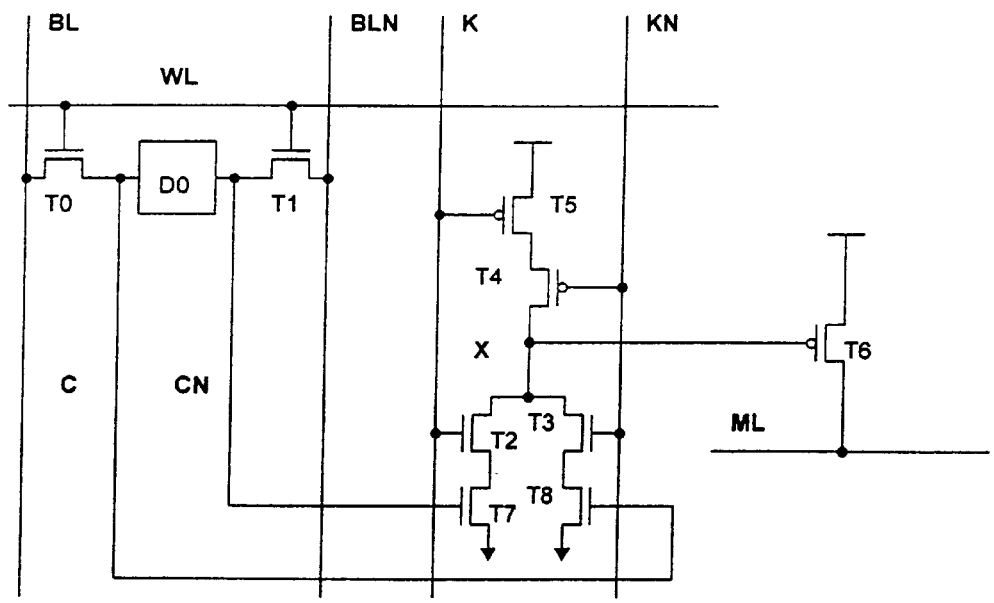
FIG. 18 illustrates a fifth embodiment of a binary CAM cell, using PMOS precharge device, active NMOS pull-down on comparator output X , and PMOS-NOR match device.
Figure 19:
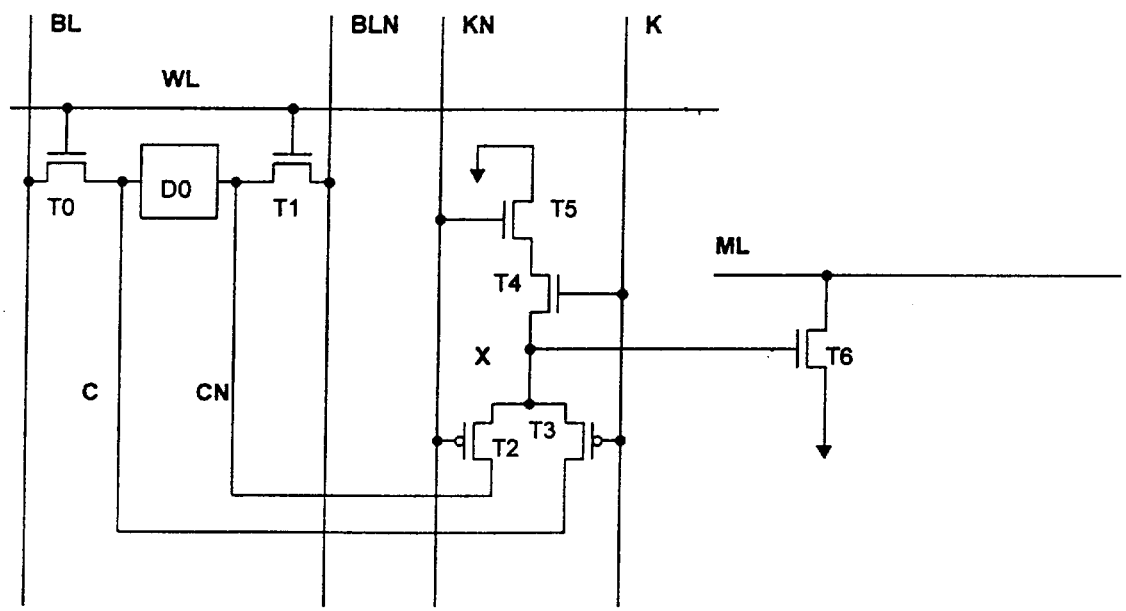
FIG. 19 illustrates a sixth embodiment of a binary CAM cell, using NMOS precharge device, passive PMOS pull-up on comparator output node X, and NMOS-NOR match device.
Figure 20:
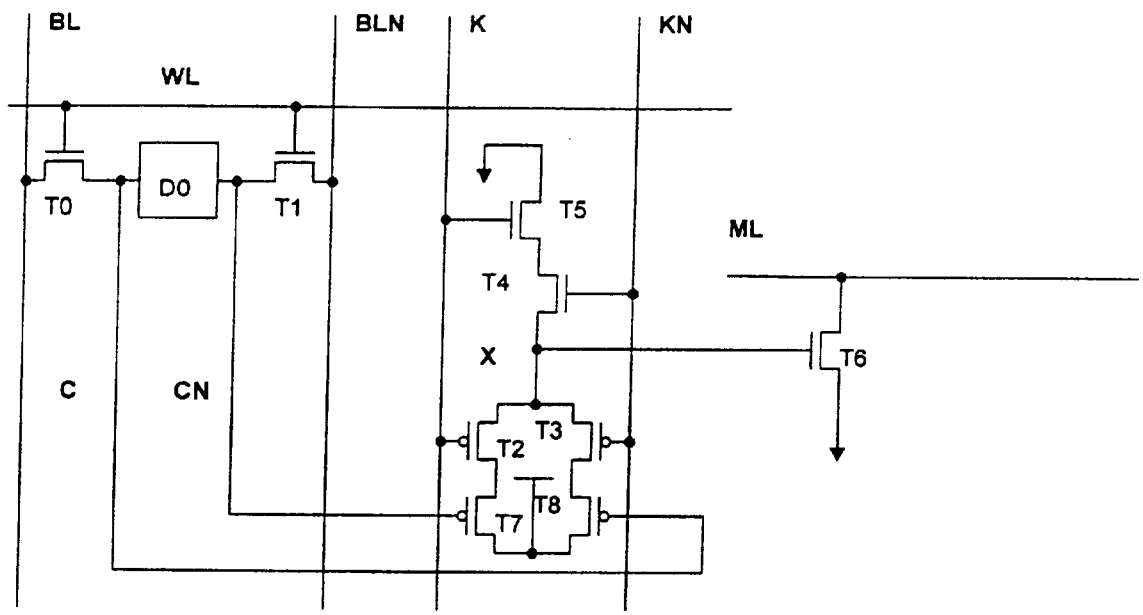
FIG. 20 illustrates a seventh embodiment of a binary CAM cell, using NMOS precharge device, active PMOS pull-up on comparator output node X, and NMOS-NOR match device.

In the fifth and sixth embodiments shown in FIGS. 18 and 19 respectively, the CAM cell employs wired-NOR matching with PMOS and NMOS match devices, respectively.

In the sixth embodiment shown in FIG. 19, NMOS precharge devices T4 and T5 is used where appropriate portions of the comparator circuits are PMOS devices.

Figure 21:
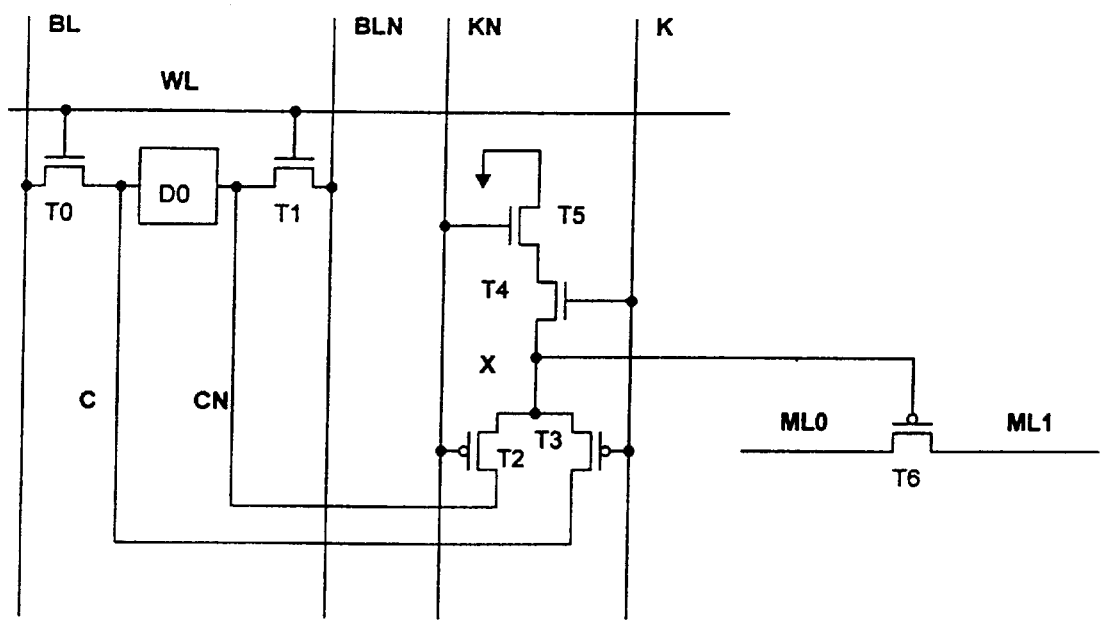
FIG. 21 illustrates an eighth embodiment of a binary CAM cell, using NMOS precharge device, passive PMOS pull-up on comparator output node X, and PMOS-NAND match device.
Figure 22:
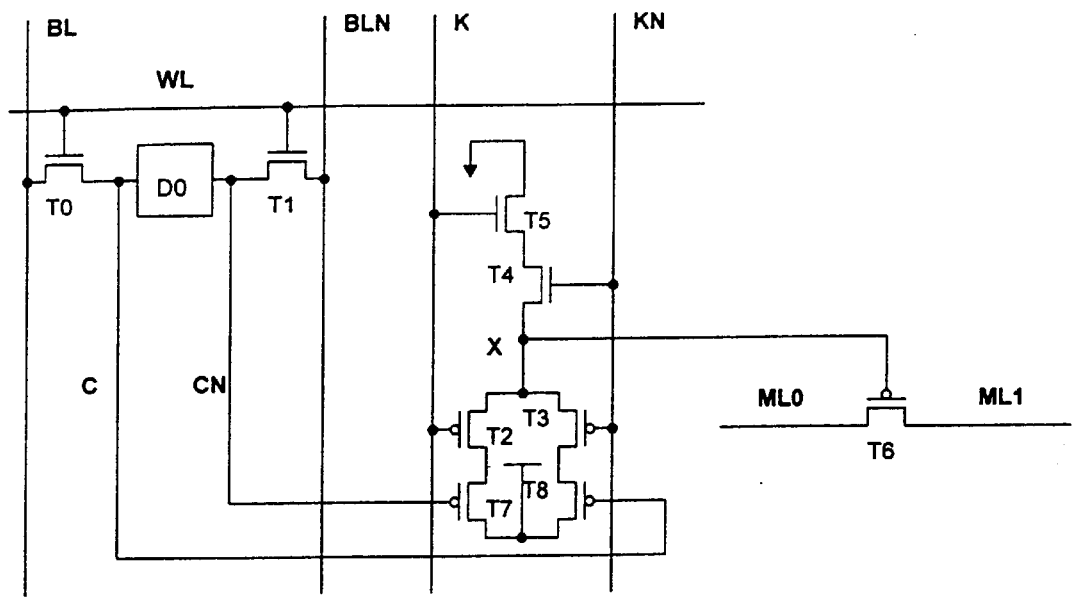
FIG. 22 illustrates a ninth embodiment a binary CAM cell, using NMOS precharge device, active PMOS pull-up on comparator output node X, and PMOS-NAND match device.
Figure 23:
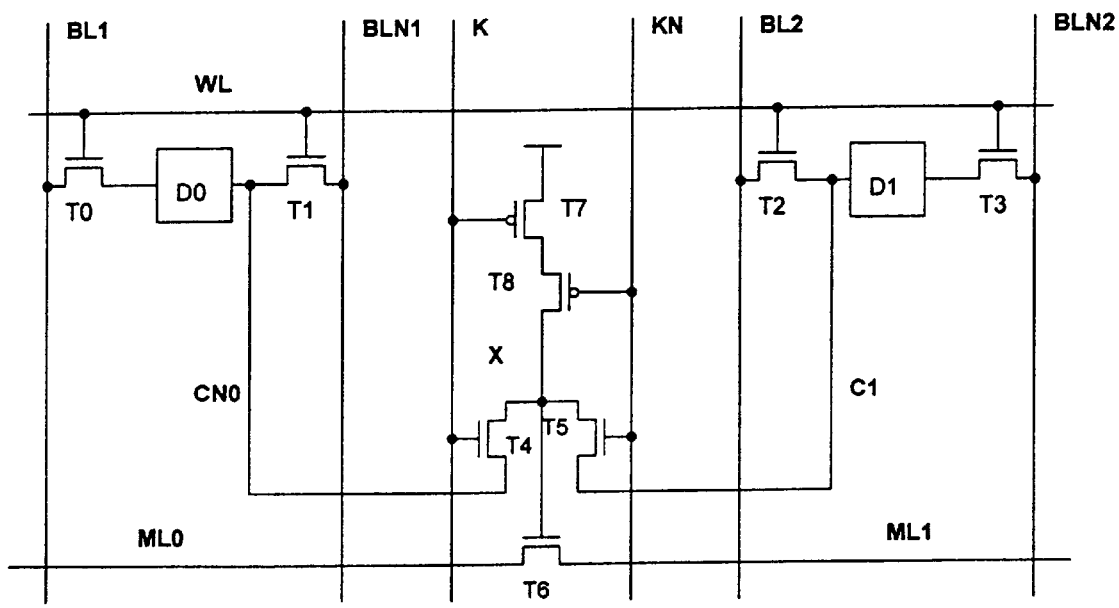
FIG. 23 illustrates a ternary CAM cell design in accordance with a tenth embodiment of the present invention, having active PMOS precharge device, passive NMOS pull-down on comparator output node X, and NMOS-NAND match device.
Figure 24:
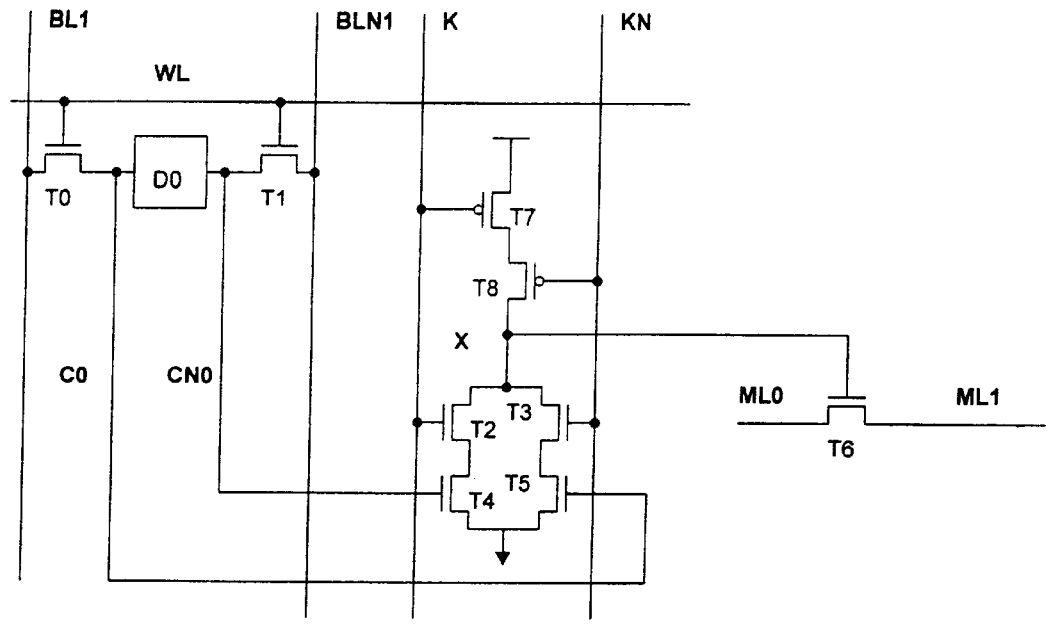
FIG. 24 illustrates a binary CAM cell, using PMOS precharge device, active NMOS pull-down on comparator output node X, and NMOS-NAND match device in accordance with an eleventh embodiment of the present invention.
Figure 25:
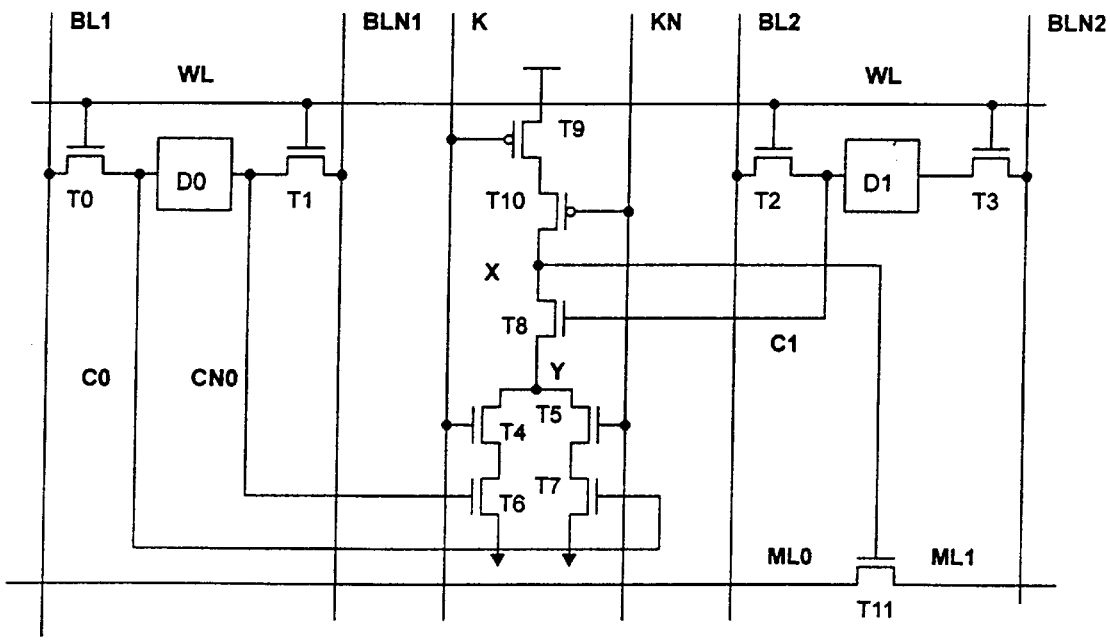
FIG. 25 illustrates a twelfth embodiment of ternary CAM cell having PMOS precharge device, single NMOS disable device, active NMOS pull-down for comparator output X, and NMOS-NAND match device.
Figure 26:
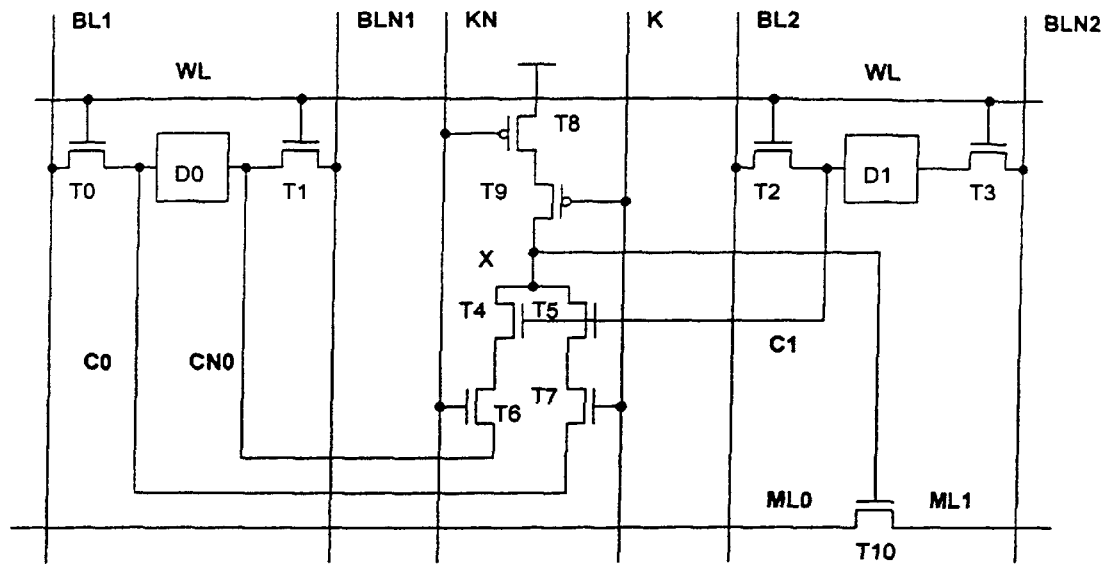
FIG. 26 illustrates a thirteenth embodiment of a ternary CAM cell having PMOS precharge device, two NMOS disable devices, passive NMOS pull-down on comparator output node X, and NMOS-NAND match device.

In the eighth embodiment shown in FIG. 21, a PMOS-NAND match chain of devices T6 is employed instead of an NMOS-NAND match chain of devices.

Figure 27:
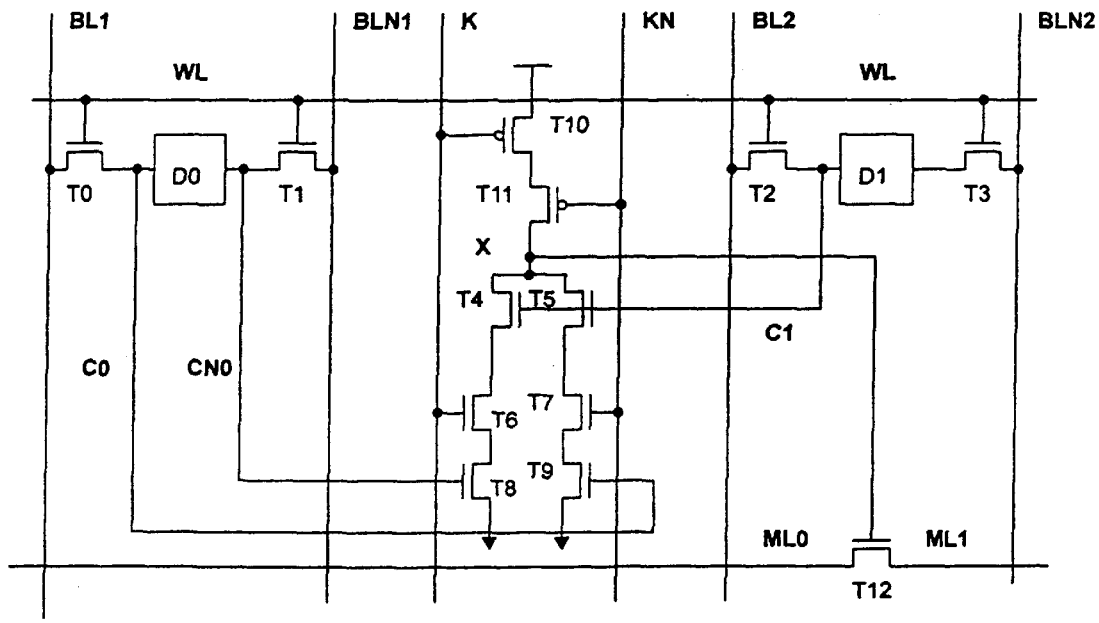
FIG. 27 illustrates a fourteenth embodiment of a ternary CAM cell having PMOS precharge device, two disable devices, active NMOS pull-down on comparator output node X, and NMOS-NAND match device.
Figure 28:
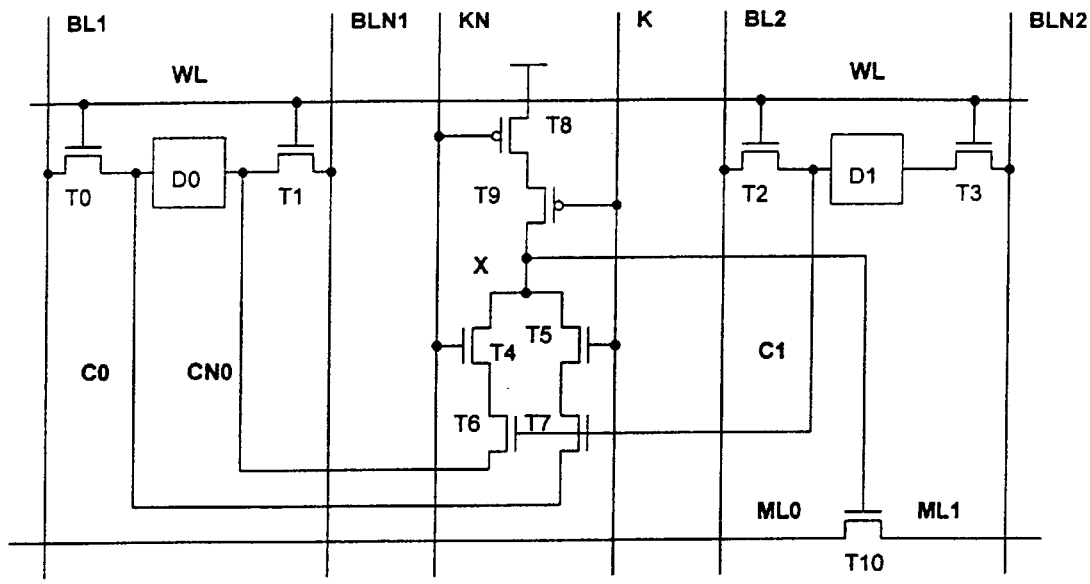
FIG. 28 illustrates a fifteenth embodiment of a ternary CAM cell having PMOS precharge device, two NMOS disable devices, passive NMOS pull-down on comparator output node X, and NMOS-NAND match device.

In the fourteenth embodiment shown in FIG. 27, two disable devices T4 and T5 are used in place of one, and may be placed elsewhere in the comparator circuits.

Figure 29:
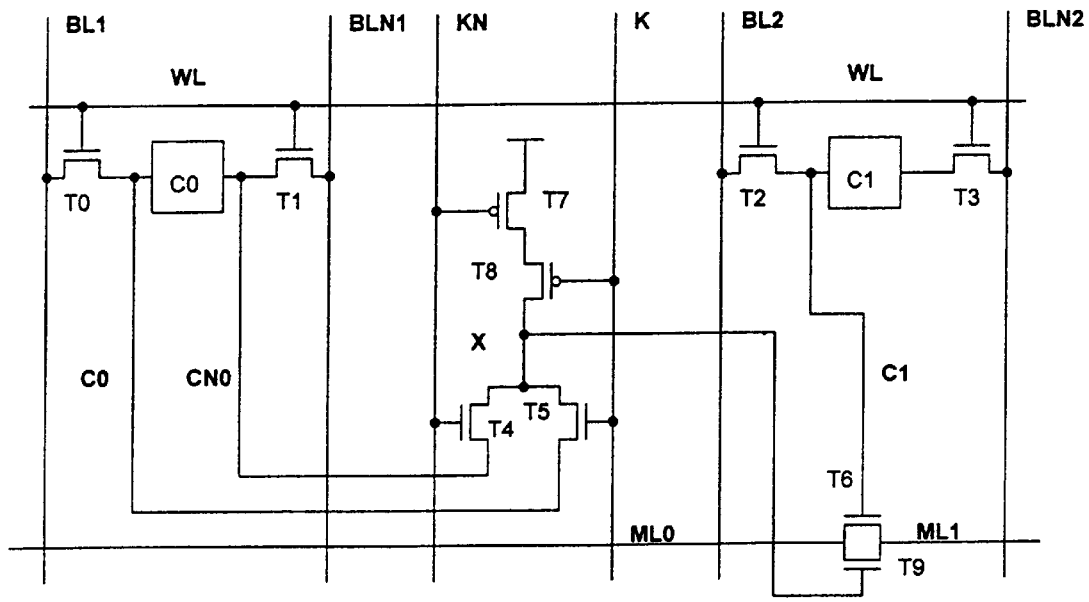
FIG. 29 illustrates a sixteenth embodiment of a ternary CAM cell having PMOS precharge device, single NMOS disable (shunt) device in NMOS-NAND chain, passive NMOS pull-down on comparator output node X, and NMOS-NAND match device.
Figure 30:
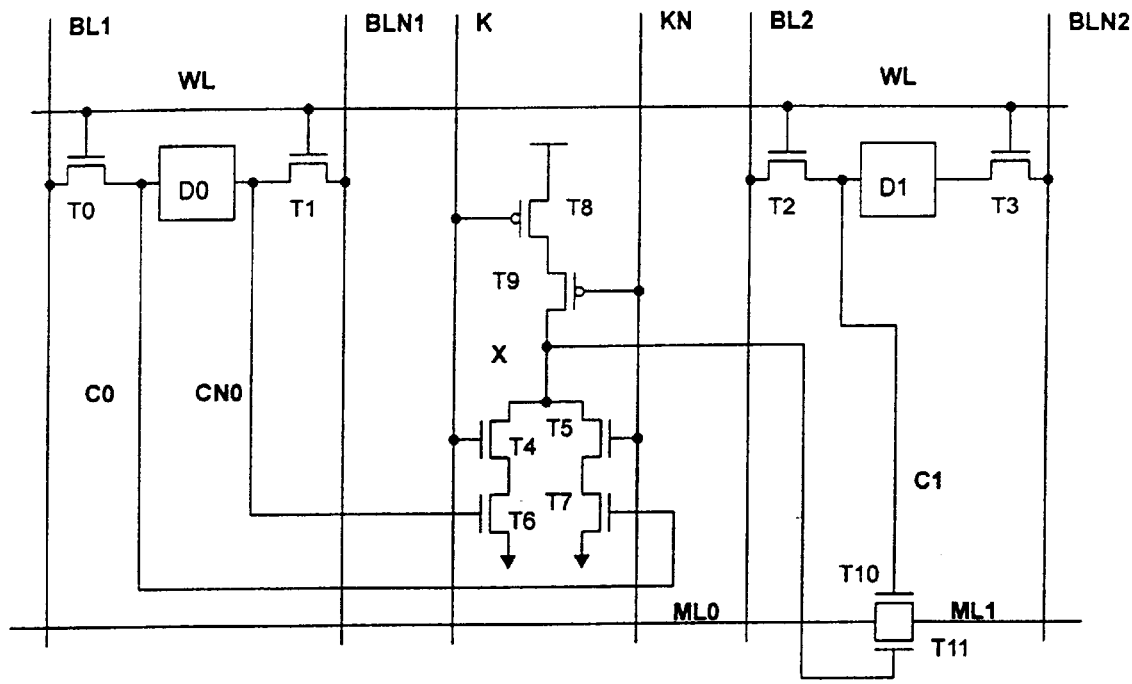
FIG. 30 illustrates a seventeenth embodiment of a ternary CAM cell having PMOS precharge device, single NMOS disable (shunt) device in NMOS-NAND chain, active NMOS pull-down on comparator output node X, and NMOS-NAND match device.
Figure 31:
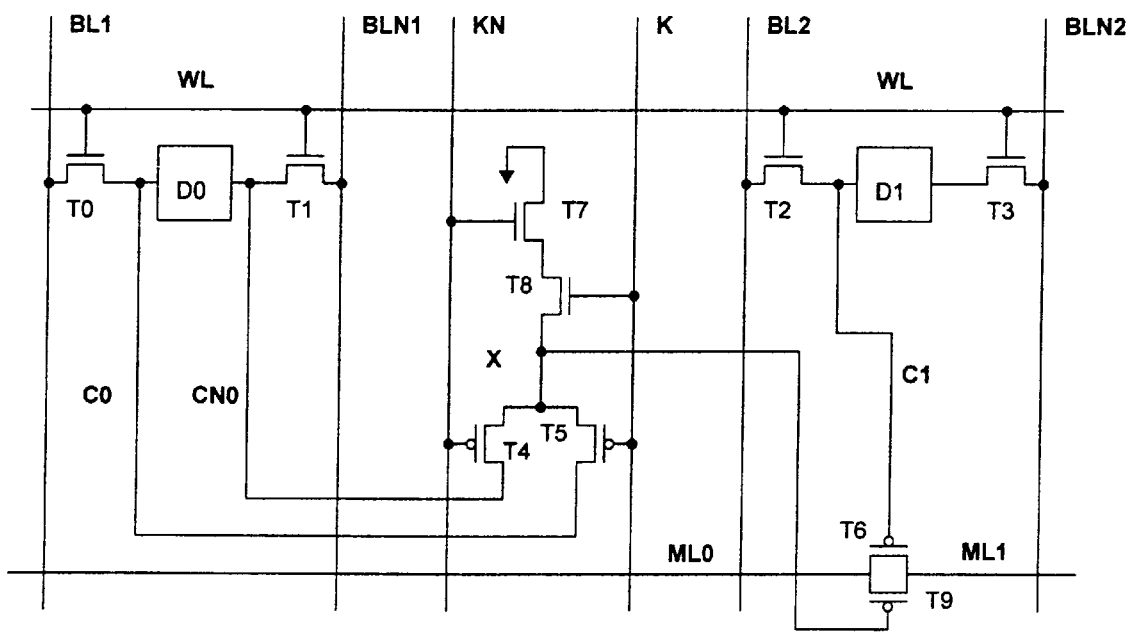
FIG. 31 illustrates an eighteenth embodiment of a ternary CAM cell having NMOS precharge device, single PMOS disable (shunt) device in PMOS-NAND chain, passive PMOS pull-up on comparator output node X, and PMOS-NAND match device.
Figure 32:
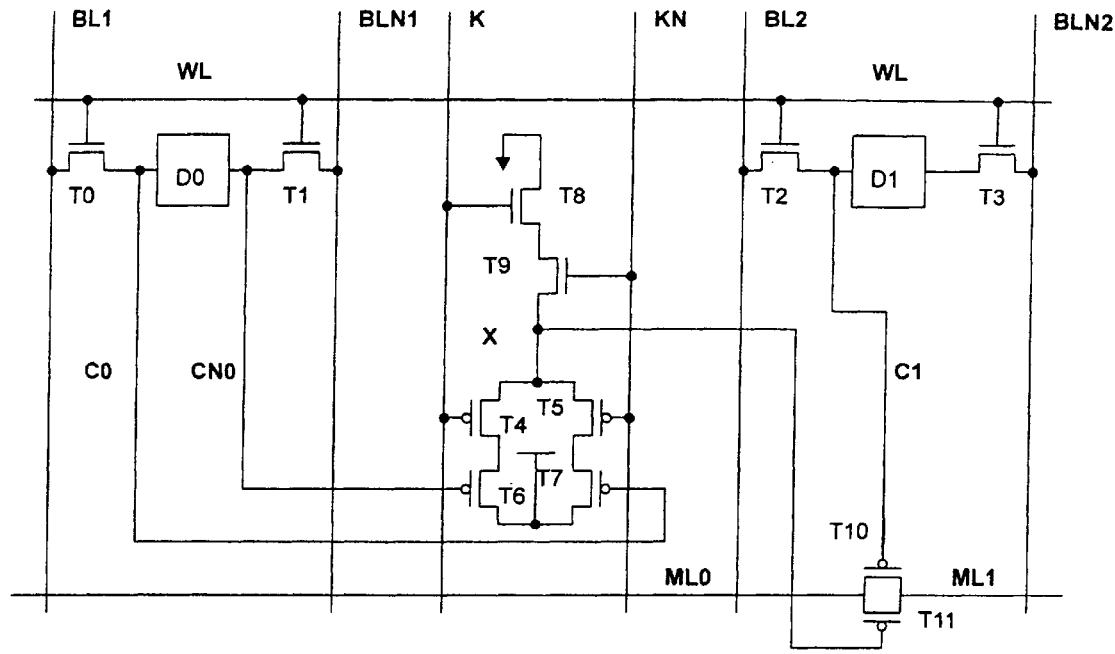
FIG. 32 illustrates a nineteenth embodiment of a ternary CAM cell having PMOS-NAND match device and NMOS precharge device.
Figure 33:
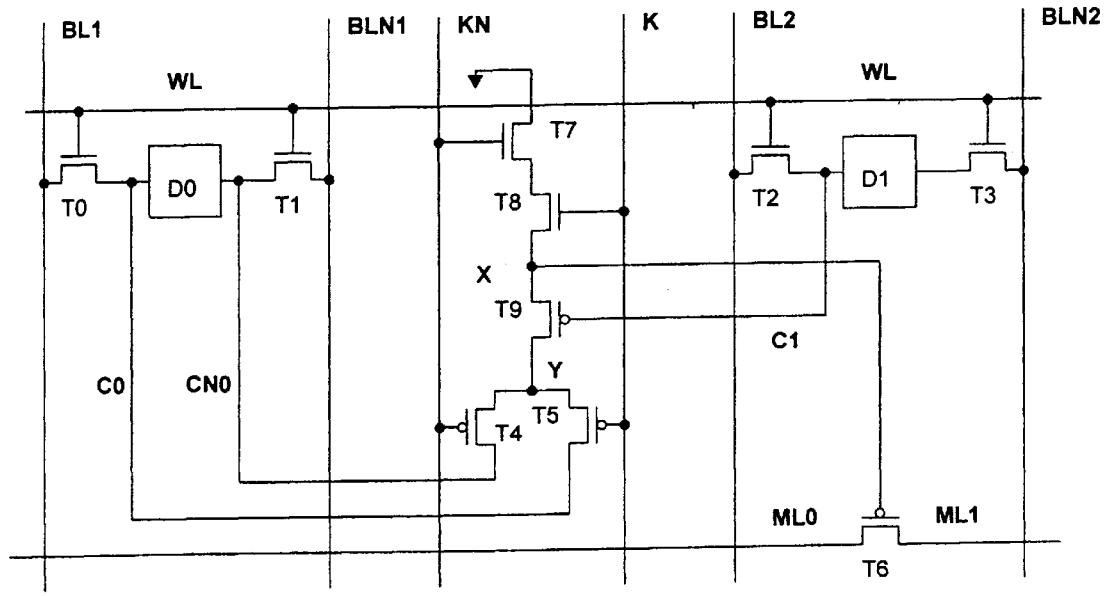
FIG. 33 illustrates a twentieth embodiment of a ternary CAM cell having NMOS precharge device, single PMOS disable device, passive PMOS pull-up on compare output node (X), PMOS-NAND match device.
Figure 34:
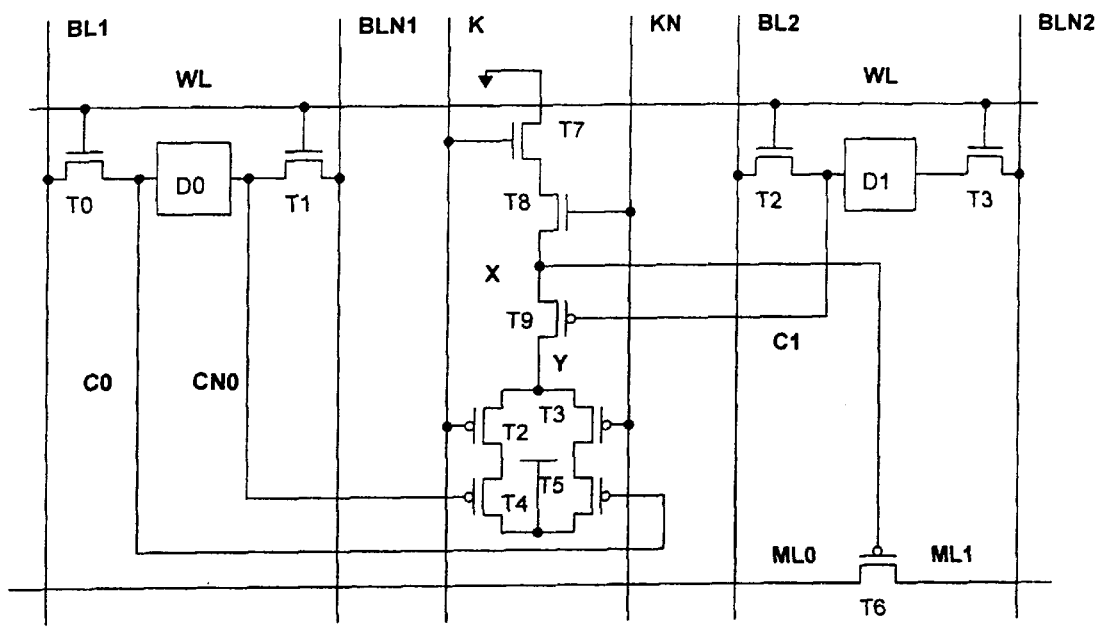
FIG. 34 illustrates a twenty-first embodiment of a ternary CAM cell having NMOS precharge device, single PMOS disable device, active PMOS pull-up on compare output node (X), PMOS-NAND match device.

In the sixteenth embodiment shown in FIG. 29, the disable device T6 is placed in the NAND match chain rather than in the comparator. This approach, however, requires more power due to unnecessary transitions in the comparator (for masked bits) and increased loading in the NAND match chain.

Of course, numerous variations and adaptations may be made to the particular embodiments of the invention described above, without departing from the spirit and scope of the invention, which is defined in the claims.

What is claimed is:

1. A content addressable memory cell comprising:

a memory element for storing a data bit, said memory element having a cell node;

access means coupled to said memory element and to a bit line, wherein said access means is responsive to a word line for coupling said cell node to said bit line during a change in signal level in said word line in a first predetermined direction;

comparator means coupled to said cell node and to a compare line for performing a comparison between signal levels at said cell node and said compare line, during a change in signal level in said compare line in a second predetermined direction, and for providing a comparator output indicative of said comparison; and resetting means for resetting said comparator means subsequent to said comparison.

2. A content addressable memory cell as defined in claim 1, further comprising match means responsive to the comparator output, wherein said content addressable memory cell is a member of a plurality of similarly formed content addressable memory cells accessing a match line driven by respective said match means of each of the content addressable memory cells.

3. A content addressable memory cell as defined in claim 2, wherein the match means for each one of the plurality of similar content addressable memory cells comprises one of a corresponding plurality of logic NAND devices positioned in series with one another along the match line.

4. A content addressable memory cell as defined in claim 2, wherein the match means for each one of the plurality of similar content addressable memory cells comprises one of a corresponding plurality of logic NOR devices positioned in parallel with one another between a power supply node and the match line.

5. A content addressable memory cell as defined in claim 1, wherein the memory element comprises a static memory device.

6. A content addressable memory cell as defined in claim 1, wherein the memory element comprises a non-volatile memory device.

7. A content addressable memory cell as defined in claim 1, wherein the memory element comprises a single-ended memory device.

8. A content addressable memory cell as defined in claim 1, wherein the memory element comprises a dynamic memory device.

9. A content addressable memory cell as defined in claim 1, wherein the access means comprises transistor means responsive to the word line for coupling the cell node to the bit line.

10. A content addressable memory cell as defined in claim 1, wherein the comparator means comprises transistor means responsive to the compare line for coupling the cell node to the comparator output.

11. A content addressable memory cell as defined in claim 1, wherein the comparator means comprises a pair of a first and a second transistor means in a series configuration for coupling the cell node to a power supply node, wherein said first transistor means is responsive to the compare line and said second transistor means is responsive to the cell node.

12. A content addressable memory cell as defined in claim 1, wherein the resetting means comprises transistor means responsive to the compare line for coupling the comparator output to a power supply node.

13. A content addressable memory cell as defined in claim 1, wherein the resetting means comprises transistor means responsive to a precharge line for coupling the comparator output to a power supply node.

14. A content addressable memory cell as defined in claim 1, further comprising:
   a mask memory element for storing a mask bit, said mask memory element having a mask cell node; and
   mask access means coupled to said mask memory element and to a mask bit line; wherein said mask access means is responsive to the word line for coupling said mask cell node to said mask bit line during a change in signal level in said word line in the first predetermined direction.

15. A content addressable memory cell comprising:
   a) a data memory element for storing a data bit, said data memory element having a data cell node;
      a mask memory element for storing a mask bit, said mask memory element having a mask cell node;
      data access means coupled to said data memory element and to a data bit line,
      mask access means coupled to said mask memory element and to a mask bit line; wherein said data and mask access means are responsive to a word line for coupling said data and mask cell nodes to said data and mask bit lines respectively during a change in signal level in said word line in a first predetermined direction;
      comparator means coupled to said data and mask cell nodes and to a compare line for performing a comparison between signal levels at said data cell node and said compare line, during a change in signal level in said compare line in a second predetermined direction, and for providing a comparator output indicative of said comparison; and
      disable means responsive to said mask cell node for disabling said comparator output when the mask cell node has a predetermined signal level.

16. A content addressable memory cell as defined in claim 15, further comprising match means responsive to the comparator output, wherein said content addressable memory cell is a member of a plurality of similarly formed content addressable memory cells accessing a match line driven by respective said match means of each of the content addressable memory cells.

17. A content addressable memory cell as defined in claim 16, wherein the match means for each one of the plurality of similar content addressable memory cells comprises one of a corresponding plurality of logic NOR devices positioned in parallel with one another between a power supply node and the match line.

18. A content addressable memory cell as defined in claim 16, wherein the match means for each one of the plurality of similar content addressable memory cells comprises one of a corresponding plurality of logic NAND devices positioned in series with one another along the match line.

19. A content addressable memory cell as defined in claim 18, wherein the disable means comprises transistor means for shunting the logic NAND device.

20. A content addressable memory cell as defined in claim 15, further comprising resetting means for resetting said comparator means subsequent to said comparison.

21. A content addressable memory cell as defined in claim 20, wherein the resetting means comprises transistor means responsive to the compare line for coupling the comparator output to a power supply node.

22. A content addressable memory cell as defined in claim 20, wherein the resetting means comprises transistor means responsive to a precharge line for coupling the comparator output to a power supply node.

23. A content addressable memory cell as defined in claim 15, wherein the disable means comprises transistor means for decoupling the comparator output from the comparator means.

24. A content addressable memory cell as defined in claim 15, wherein the disable means comprises transistor means for decoupling the data cell node from the comparator means.

25. A content addressable memory cell as defined in claim 15, wherein the disable means comprises transistor means for shunting the comparator means.

26. A content addressable memory cell as defined in claim 15, wherein each of the data memory element and the mask memory element comprises a static memory device.

27. A content addressable memory cell as defined in claim 15, wherein each of the data memory element and the mask memory element comprises a non-volatile memory device.

28. A content addressable memory cell as defined in claim 15, wherein each of the data memory element and the mask memory element comprises a single-ended memory device.

29. A content addressable memory cell as defined in claim 15, wherein each of the data memory element and the mask memory element comprises a dynamic memory device.

30. A content addressable memory cell as defined in claim 15, wherein the data access means comprises transistor means responsive to the word line for coupling the data cell node to the data bit line, and the mask access means comprises transistor means responsive to the word line for coupling the mask cell node to the mask bit line.

31. A content addressable memory cell as defined in claim 15, wherein the comparator means comprises transistor means responsive to the compare line for coupling the data cell node to the comparator output.

32. A content addressable memory cell as defined in claim 15, wherein the comparator means comprises a pair of a first and a second transistor means in a series configuration for coupling the data cell node to a power supply node, said first transistor means being responsive to the compare line and said second transistor means being responsive to the data cell node.

* * * * *

UNITED STATES PATENT AND TRADEMARK OFFICE
CERTIFICATE OF CORRECTION

PATENT NO. : 6,044,005
DATED : March 28, 2000
INVENTOR(S) : Gibson et al.

It is certified that error appears in the above-identified patent and that said Letters Patent is hereby corrected as shown below:

ON THE TITLE PAGE:

Item [75] Inventors:

Line 2, delete "Farhard" and replace with --Farhad--.

Signed and Sealed this

Twentieth Day of February, 2001

Attest:

NICHOLAS P. GODICI

Attesting Officer    Acting Director of the United States Patent and Trademark Office